(12) United States Patent
Gokan et al.

(10) Patent No.: US 7,808,094 B2
(45) Date of Patent: Oct. 5, 2010

(54) STACKED STRUCTURE OF SEMICONDUCTOR CHIPS, MEMORY CARD, AND METHOD OF MANUFACTURING STACKED STRUCTURE OF SEMICONDUCTOR CHIPS

(75) Inventors: Manabu Gokan, Hyogo (JP); Akihisa Nakahashi, Osaka (JP); Koichi Nagai, Kyoto (JP); Naoki Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 255 days.

(21) Appl. No.: 12/022,234

(22) Filed: Jan. 30, 2008

(65) Prior Publication Data

US 2008/0185731 A1 Aug. 7, 2008

(30) Foreign Application Priority Data

Feb. 1, 2007 (JP) ............................. 2007-022533

(51) Int. Cl.
*H01L 23/02* (2006.01)
(52) U.S. Cl. ...................................... 257/686; 257/777
(58) Field of Classification Search ................ 257/686, 257/723, 724, 777
See application file for complete search history.

(56) References Cited

U.S. PATENT DOCUMENTS

| | | | | |
|---|---|---|---|---|
| 6,762,078 B2 * | 7/2004 | Shin et al. | ................... | 438/123 |
| 7,061,087 B2 * | 6/2006 | Kim | ............................ | 257/686 |
| 7,638,868 B2 * | 12/2009 | Haba | ........................... | 257/686 |
| 2004/0104469 A1 | 6/2004 | Yagi et al. | | |
| 2006/0091518 A1 * | 5/2006 | Grafe et al. | ................. | 257/686 |
| 2007/0057358 A1 * | 3/2007 | Satou et al. | ................. | 257/686 |
| 2010/0001391 A1 * | 1/2010 | Do et al. | ..................... | 257/686 |

FOREIGN PATENT DOCUMENTS

JP 2002-207986 A 7/2002

* cited by examiner

*Primary Examiner*—S. V Clark
(74) *Attorney, Agent, or Firm*—RatnerPrestia

(57) ABSTRACT

A stacked structure of semiconductor chips includes plural stacked semiconductor chips and plural tabular holding members which hold the respective semiconductor chips. At least two holding members among the holding members are arranged in places at ends of the semiconductor chips where inner side facets of the holding members are opposed to each other, at least one semiconductor chip of the two semiconductor chips held by the two holding members, respectively, is held by only one holding member of the holding members at one end of the semiconductor chip, and all or a part of the one semiconductor chip is arranged in the largest space positioned in an inner side of the inner side facet of the other holding member of the holding members, the largest space being formed by a surface including the one surface of the other holding member, a surface including the other surface of the other holding member, and a surface including a surface of the other semiconductor chip held by the other holding member, the other semiconductor chip being closer to the other holding member.

11 Claims, 30 Drawing Sheets

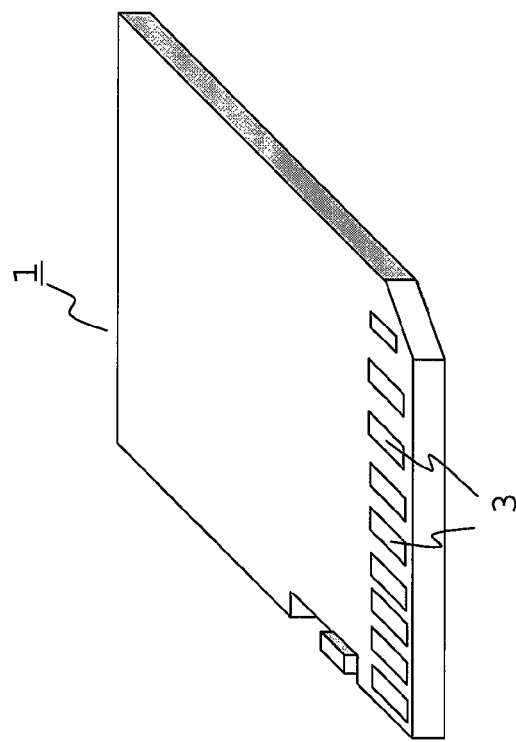
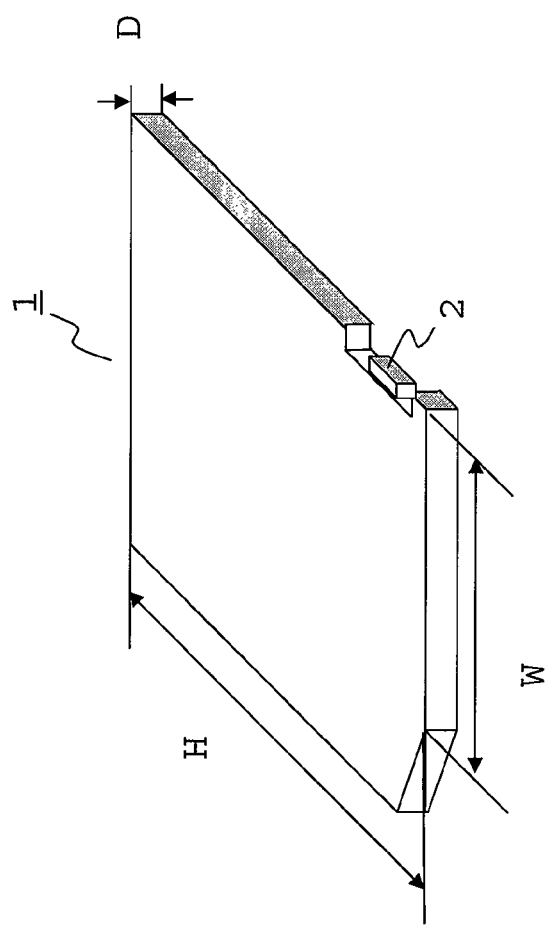

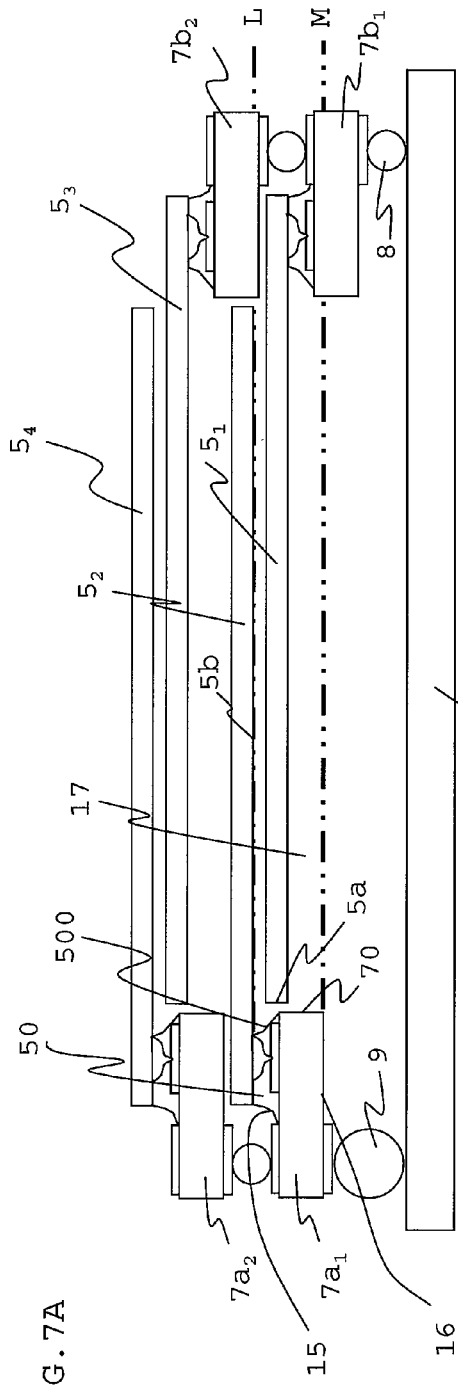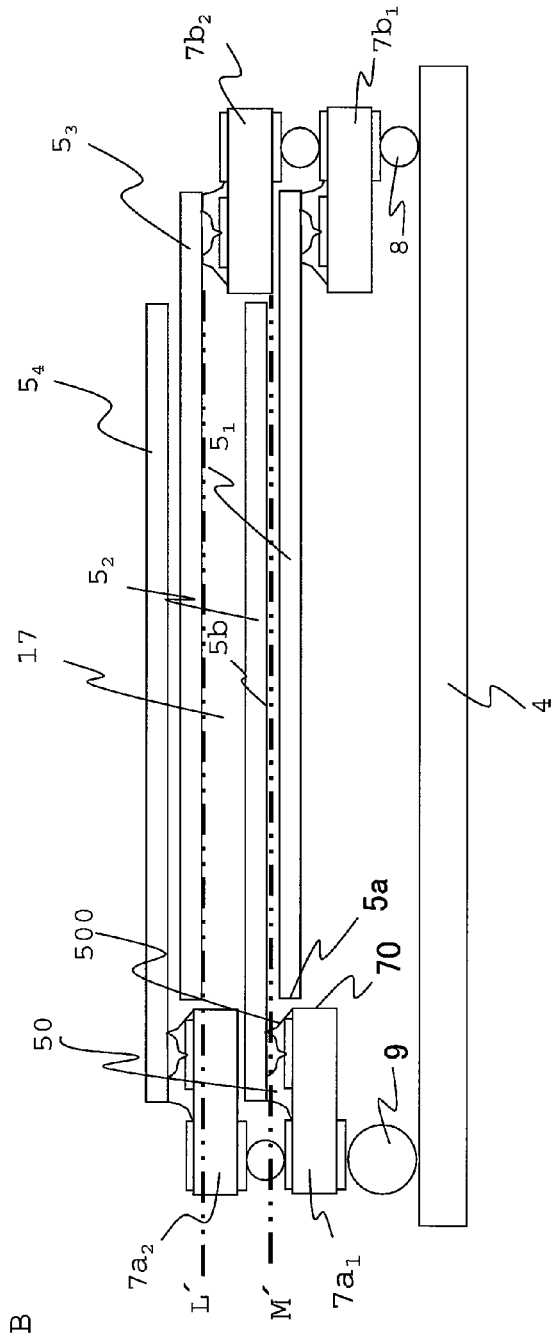
FIG. 7A
FIG. 7B

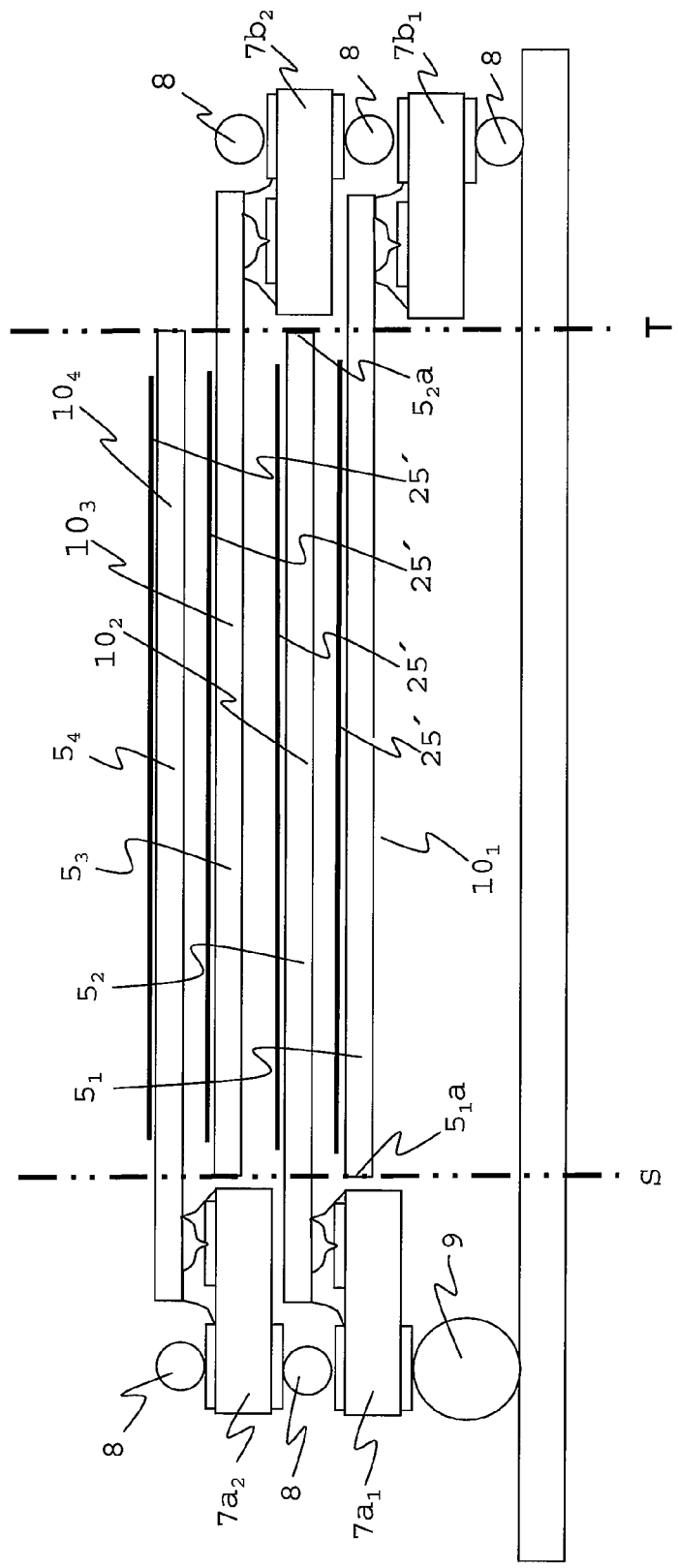

STACKED STRUCTURE OF SEMICONDUCTOR CHIPS, MEMORY CARD, AND METHOD OF MANUFACTURING STACKED STRUCTURE OF SEMICONDUCTOR CHIPS

BACKGROUND OF THE INVENTION

1. Field of the Invention

The present invention relates to a stacked structure of semiconductor chips, a memory card, and a method of manufacturing the stacked structure of semiconductor chips.

2. Related art of the Invention

In recent years, small memory cards such as an SD memory card are often used as recording media in cellular phones, digital cameras, and the like. According to improvement of functions of apparatuses such as an increase in the number of pixels of the digital cameras, an increase in capacities of the memory cards is demanded.

A stacked structure formed by stacking plural semiconductor chips in order to realize such an increase in a capacity of a memory card is disclosed. FIG. 26 is a diagram showing a stacked structure of semiconductor chips of the prior art. In the stacked structure of semiconductor chips shown in FIG. 26, a semiconductor chip 105 is mounted on one side of a substrate 107. Four pairs of the substrate 107 and the semiconductor chip 105 are stacked on a mother board 104. The substrates 107 arranged to be adjacent to each other in a vertical direction in the figure are electrically connected by solder balls 108. In the figure, the substrate 107 arranged at the bottom and the mother board 104 are also electrically connected by the solder balls 108.

As shown in FIG. 27, a stacked structure in which semiconductor chips are arranged on both sides of the substrates 107 is disclosed (see, for example, Japanese Patent Laid-Open No. 2002-207986). In the stacked structure of semiconductor chips shown in FIG. 27, two pairs of the substrate 107 and the semiconductor chip 105 mounted on both sides of the substrate 107 are stacked on the mother board 104. In places where the semiconductor chips 105 are opposed to each other, insulating sheets 125 are arranged.

However, even if it is attempted to realize a further increase in a capacity of the SD memory card, a size of the SD memory card is determined according to its own standard and it is necessary to secure to have a certain thickness of the substrates 107. Therefore, there is a limit in stacking the semiconductor chips 105 by the method described above.

In order to realize the increase in a capacity of the SD memory card, it is also conceivable to use a semiconductor chip with a large capacity. However, compared with the structure formed by stacking plural semiconductor chips with low unit cost and a small capacity, cost substantially increases.

The present invention has been devised in view of the problems of the stacked structures of semiconductor chips in the past and it is an object of the present invention to provide a stacked structure of semiconductor chips in which semiconductor chips larger in number than in the prior art can be stacked, a memory card, and a method of manufacturing the stacked structure of semiconductor chips.

SUMMARY OF THE INVENTION

The $1^{st}$ aspect of the present invention is a stacked structure of semiconductor chips comprising:

plural stacked semiconductor chips; and plural tabular holding members which hold the respective semiconductor chips, wherein at least two holding members among the holding members are arranged in places at ends of the semiconductor chips where inner side facets of the holding members are opposed to each other, at least one semiconductor chip of the two semiconductor chips held by the two holding members, respectively, is held by only one holding member of the holding members at one end of the semiconductor chip, and all or a part of the one semiconductor chip is arranged in the largest space positioned in an inner side of the inner side facet of the other holding member of the holding members, the largest space being formed by a surface including the one surface of the other holding member, a surface including the other surface of the other holding member, and a surface including a surface of the other semiconductor chip held by the other holding member, the other semiconductor chip being closer to the other holding member.

The $2^{nd}$ aspect of the present invention is the stacked structure of semiconductor chips according to the $1^{st}$ aspect of the present invention, wherein the semiconductor chip is held on at least one surface of the one holding member.

The $3^{rd}$ aspect of the present invention is the stacked structure of semiconductor chips according to the $2^{nd}$ aspect of the present invention, wherein the other semiconductor chip is adjacent to the one semiconductor chip and held by only the other holding member at the other end opposed to the one end, and the largest space is a space positioned in an inner side of the inner side facet of the other holding member and is formed by a surface including a surface on an opposite side of the other semiconductor chip side of the other holding member and a surface including a surface on the holding member side of the other semiconductor chip.

The $4^{th}$ aspect of the present invention is the stacked structure of semiconductor chips according to the $3^{rd}$ aspect of the present invention, wherein the plural stacked semiconductor chips have a plurality of the one semiconductor chips and a plurality of the other semiconductor chips both of which are alternately stacked, and all or a part of the other semiconductor chip is arranged in a space positioned in an inner side of the inner side facet of the one holding member, the space being formed by a surface including a surface on an opposite side of the one semiconductor chip side of the one holding member and a surface including a surface on the one holding member side of the one semiconductor chip.

The $5^{th}$ aspect of the present invention is the stacked structure of semiconductor chips according to the $1^{st}$ aspect of the present invention, wherein the semiconductor chips are held on both surfaces of the other holding member, the largest space is a space positioned in an inner side of the inner side facet of the other holding member and is formed by a surface including a surface on the holding member side of the semiconductor chip held on one surface of the other holding member and a surface including a surface on the holding member side of the semiconductor chip held on the other surface of the other holding member, and arrangement of the entire one semiconductor ship or a part of the one semiconductor chip in the space means that the semiconductor chip held by the one holding member is arranged between the semiconductor chips arranged on both the surfaces of the other holding member.

The $6^{th}$ aspect of the present invention is the stacked structure of semiconductor chips according to the $5^{th}$ aspect of the present invention, wherein the semiconductor chips are held on both surfaces of the one holding member, and one semiconductor chip of the semiconductor chips held on both the surfaces of the one holding member is arranged between the semiconductor chips arranged on both the surfaces of the other holding member.

The 7$^{th}$ aspect of the present invention is the stacked structure of semiconductor chips according to the 6$^{th}$ aspect of the present invention, wherein one semiconductor chip of the semiconductor chips held on both surfaces of the one holding member by one holding member adjacent to the one holding member is further arranged between the semiconductor chips arranged on both the sides of the other holding member. The 8$^{th}$ aspect of the present invention is the stacked structure of semiconductor chips according to the 1$^{st}$ aspect of the present invention, wherein the holding members are substrates, and the semiconductor chips are mounted on the substrates by flip chip or wire bonding.

The 9$^{th}$ aspect of the present invention is the stacked structure of semiconductor chips according to the 8$^{th}$ aspect of the present invention, wherein adjacent substrates of the substrates are electrically connected by a conductive member, and a space between the adjacent substrates is adjusted by the conductive member.

The 10$^{th}$ aspect of the present invention is a memory card comprising:

a mother board on which one or plural stacked modules having the stacked structure of semiconductor chips according to the 1$^{st}$ aspect of the present invention are arranged; and an IC chip for controlling the semiconductor chips.

The 11$^{th}$ aspect of the present invention is a method of manufacturing a stacked structure of semiconductor chips including plural stacked semiconductor chips and plural tabular holding members which hold the respective semiconductor chips, the method comprising a stacking step of arranging the semiconductor chip held by the holding member at one end thereof such that at least a part of the semiconductor chip overlaps a space formed on inner sides of inner side facets of the holding members which hold the other semiconductor chips.

The 12$^{th}$ aspect of the present invention is a method of manufacturing a stacked structure of semiconductor chips including: plural stacked semiconductor chips; and plural tabular holding members which hold the respective semiconductor chips, in which at least two holding members among the holding members are arranged in places at ends of the semiconductor chips where inner side facets of the holding members are opposed to each other, and at least one semiconductor chip of the two semiconductor chips held by the two holding members, respectively, is held by only one holding member of the holding members at one end of the semiconductor chip, the method comprising a stacking step of arranging semiconductor chips so that all or a part of the one semiconductor chip is arranged in the largest space positioned in an inner side of the inner side facet of the other holding member of the holding members, the largest space being formed by a surface including the one surface of the other holding member, a surface including the other surface of the other holding member, and a surface including a surface of the other semiconductor chip held by the other holding member, the other semiconductor chip being closer to the other holding member.

The 13$^{th}$ aspect of the present invention is a stacked structure of semiconductor chips comprising:

plural stacked semiconductor chips; and plural tabular holding members which hold the respective semiconductor chips, wherein at least two holding members among the holding members are arranged in places at ends of the semiconductor chips, at least one semiconductor chip of the two semiconductor chips held by the two holding members, respectively, is held by only one holding member of the holding members at one end of the semiconductor chip, and all or a part of the one semiconductor chip is arranged so as to be intersected the other semiconductor chip in the view of the direction of stacking, and arranged in the largest space positioned in an inner side of the inner side facet of the other holding member of the holding members, the largest space being formed by a surface including the one surface of the other holding member, a surface including the other surface of the other holding member, and a surface including a surface of the other semiconductor chip held by the other holding member, the other semiconductor chip being closer to the other holding member.

The 14$^{th}$ aspect of the present invention is a semiconductor device, comprising:

a plurality of semiconductor chips; and a plurality of substrates to which said semiconductor chips are mounted to, respectively;

one of said substrates on a left side of said device, one of said chips mounted thereto extending past a right edge of said one of said substrates;

another of said substrates on a right side of said device, another said of chips mounted thereto extending past a left edge of said another of said substrates;

said another of said chips partially over and laterally offset relative to said one of said chips.

According to the present invention, it is possible to provide a stacked structure of semiconductor chips in which semiconductor chips larger in number than in the prior art can be stacked, a memory card, and a method of manufacturing the stacked structure of semiconductor chips.

BRIEF DESCRIPTION OF THE DRAWINGS

FIG. 1A is a front view of an SD memory card according to a first embodiment of the present invention;

FIG. 1B is a rear view of the SD memory card according to the first embodiment;

FIG. 7A is a diagram showing part of the structure of the stacked module 6 according to the first embodiment;

FIG. 7B is a diagram showing part of the structure of the stacked module 6 according to the first embodiment;

FIG. 14 is a diagram for explaining a modification of an insulating sheet of a stacked module according to the first embodiment;

DESCRIPTION OF SYMBOLS

Figure 2:
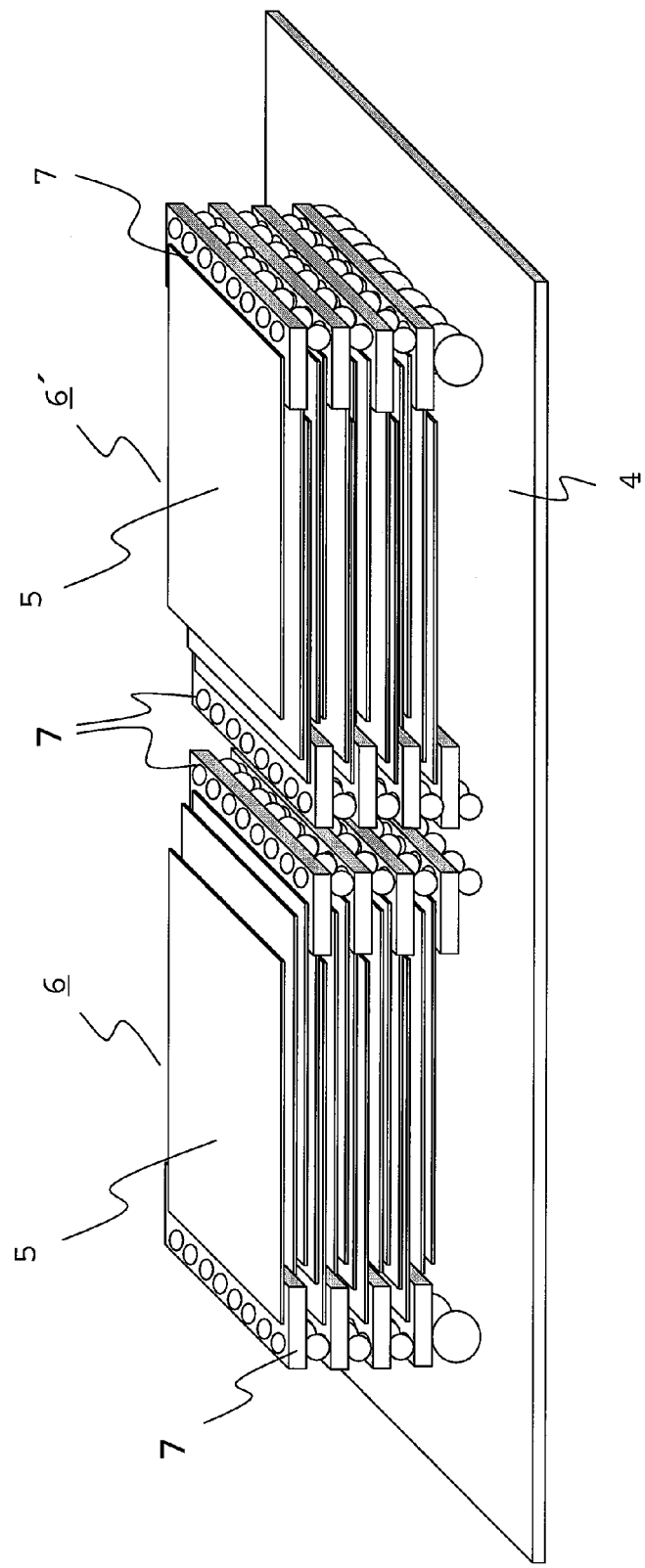
FIG. 2 is a perspective view of stacked modules 6 and 6' according to the first embodiment.

1 SD memory card
2 Changeover switch
3 Electrodes
4 Mother board
5 Semiconductor chips
6, 6' Stacked modules
7 Substrates
8, 9 Solder balls
10 Modules
11 Lands for ball
12 Lands for bump
13 Au bumps
14 Reinforcing resin

PREFERRED EMBODIMENTS OF THE INVENTION

Embodiments of the present invention will be hereinafter explained with reference to the accompanying drawings.

First Embodiment

The stacked structure of semiconductor chips according to a first embodiment of the present invention is explained below. An SD memory card as an example of a memory card according to the present invention is also described.

FIG. 1A is an external view of an SD memory card according to the first embodiment viewed from a front surface thereof. FIG. 1B is an external view of the SD memory card according to the first embodiment viewed from a rear surface thereof.

An SD memory card (Secure Digital memory card) 1 shown in FIG. 1A is tabular and a size of the SD memory card 1 is decided by a standard. As the size of the SD memory card 1, width W is 24 mm, height H is 32 mm, and thickness D is 2.1 mm. A changeover switch 2 for switching protect of data is provided in the SD memory card 1. As shown in FIG. 1B, plural electrodes 3 are arranged on one end side of the SD memory card 1. In the SD memory card 1, a mother board is arranged and plural semiconductor chips are stacked on the mother board as memory chips.

Figure 3:
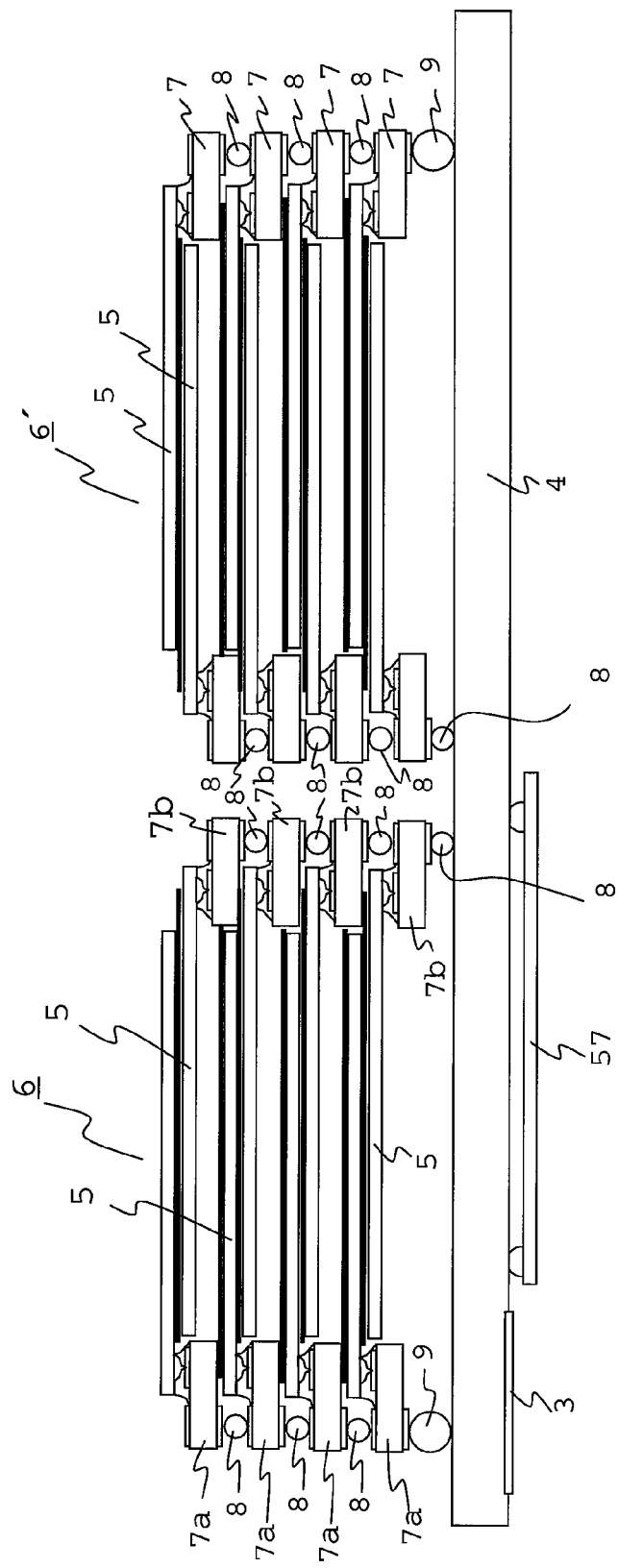
FIG. 3 is a front sectional view of the stacked modules 6 and 6' according to the first embodiment.
Figure 4:
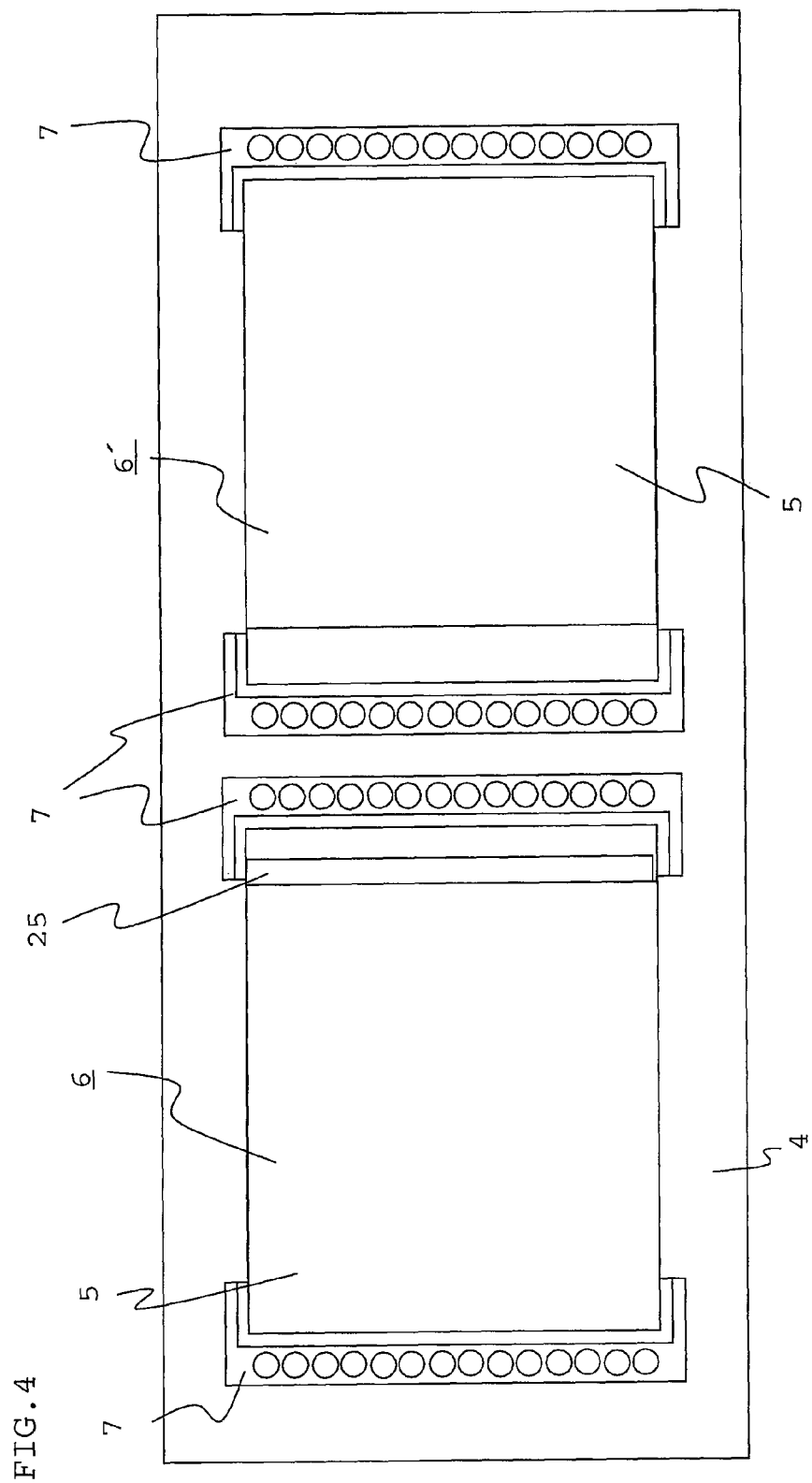
FIG. 4 is a plan view of the stacked modules 6 and 6' according to the first embodiment.

FIG. 2 is a perspective view showing stacked module of the semiconductor chips stacked on the mother board in the SD memory card 1. FIG. 3 is a sectional view of FIG. 2. FIG. 4 is a plan view of FIG. 2. In the following explanation of this specification, a direction in which a stacked module 6 is arranged with respect to a mother board 4 is defined as an upward direction. As shown in FIGS. 2 to 4, stacked modules 6 and 6' in each of which eight semiconductor chips 5 are stacked are arranged on the mother board 4. Since the stacked module 6' is arranged to be symmetrical to the stacked module 6 in the figure, explanation of the stacked module 6' is omitted. Two stacked modules 6 may be arranged not to be symmetrical to each other.

The structure of the stacked module 6 is explained.

As shown in the sectional view in FIG. 3, the stacked module 6 includes eight substrates 7 on which the eight stacked semiconductor chips 5 are mounted, respectively. As the substrates 7, FR-4 (Flame Retardant Type 4) formed of a mixed material of glass fiber and epoxy resin is used.

In FIG. 3, a controller IC 57 which controls the semiconductor chips 5 is arranged on a lower side of the mother board 4. An electrode 3 shown in FIG. 1B is provided on a surface on the lower side of the mother board 4.

In FIG. 3, the semiconductor chip 5 arranged at the bottom is mounted on the substrate 7 arranged on a lower side at a right end of the semiconductor chip 5. The second semiconductor chip 5 from the bottom is mounted on the substrate 7 arranged on a lower side at a left end of the semiconductor chip 5. The third semiconductor chip 5 from the bottom is mounted on the substrate 7 arranged on a lower side at a right end of the semiconductor chip 5.

In this way, one semiconductor chip 5 is mounted on one substrate 7 to form one module 10 (see FIG. 5 referred to below). The stacked module 6 includes plural modules 10 in which the semiconductor chips 5 are alternately mounted on the substrates 7 at the different ends of the semiconductor chips 5.

The structure of the module 10 is explained.

Figure 5:
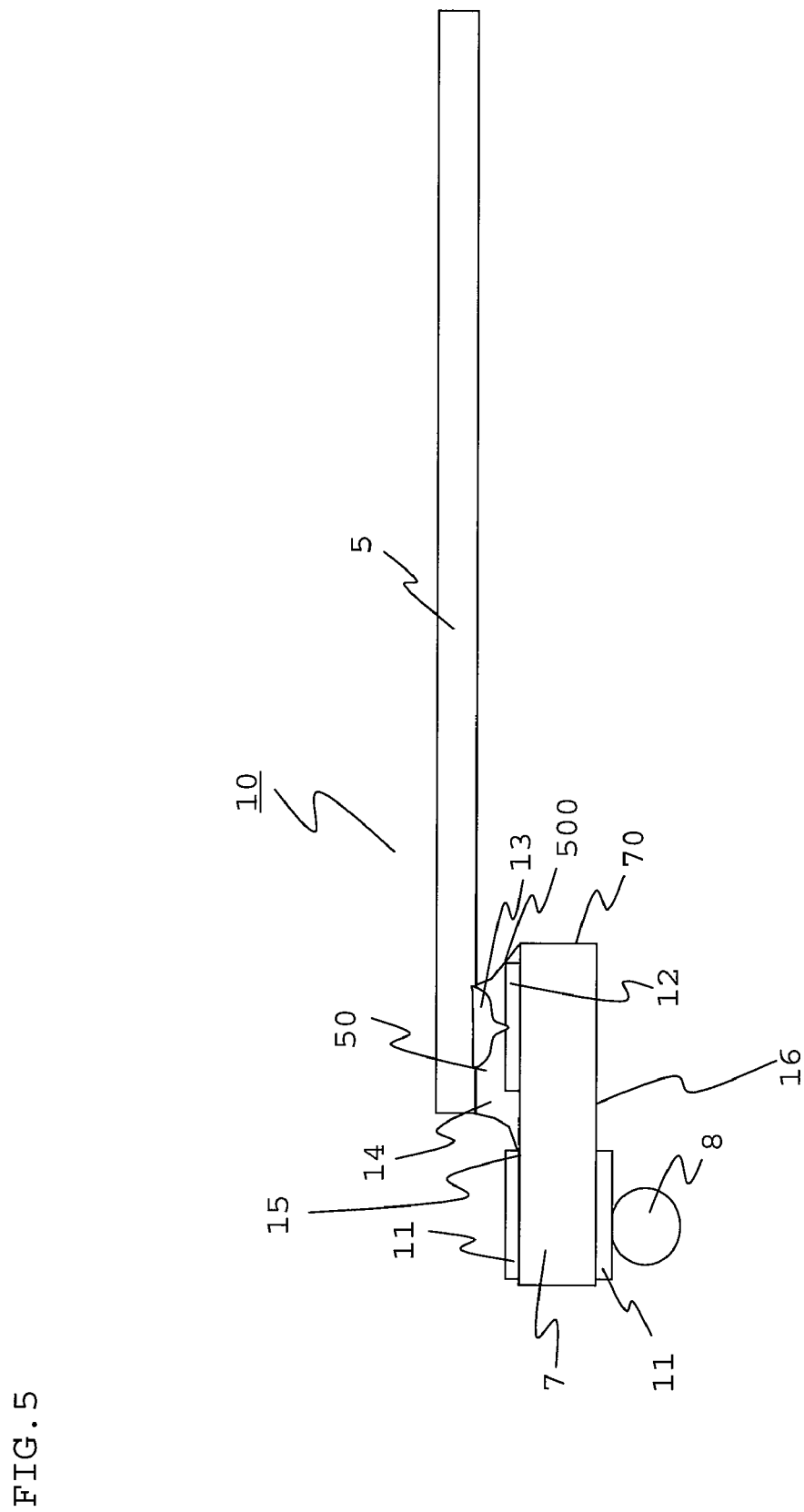
FIG. 5 is a front sectional view of a module 10 according to the first embodiment.

FIG. 5 is a diagram of one module 10 including the substrate 7 and the semiconductor chip 5 mounted on the substrate 7. The semiconductor chip 5 is mounted on the substrate 7 by flip chip. Lands for ball 11 for electrically connecting the substrates 7 using solder balls 8 and 9 are provided on an upper surface 15 and a lower surface 16 of the substrate 7 of the module 10. A connecting section 50 for connecting the substrate 7 and the semiconductor chip 5 is provided at an inner side of the lands for ball 11 on the upper surface 15.

The connecting section 50 includes a land for bump 12 formed on the upper surface 15 of the substrate 7, an Au bump 13 provided on the land for bump 12, and reinforcing resin 14 such as an NCF (Non-Conductive Film) provided to cover the periphery of the land for bump 12 and the Au bump 13. The substrate 7 and the semiconductor chip 5 are electrically connected by the land for bump 12 and the Au bump 13.

The arrangement of the respective modules 10 is explained.

Figure 6:
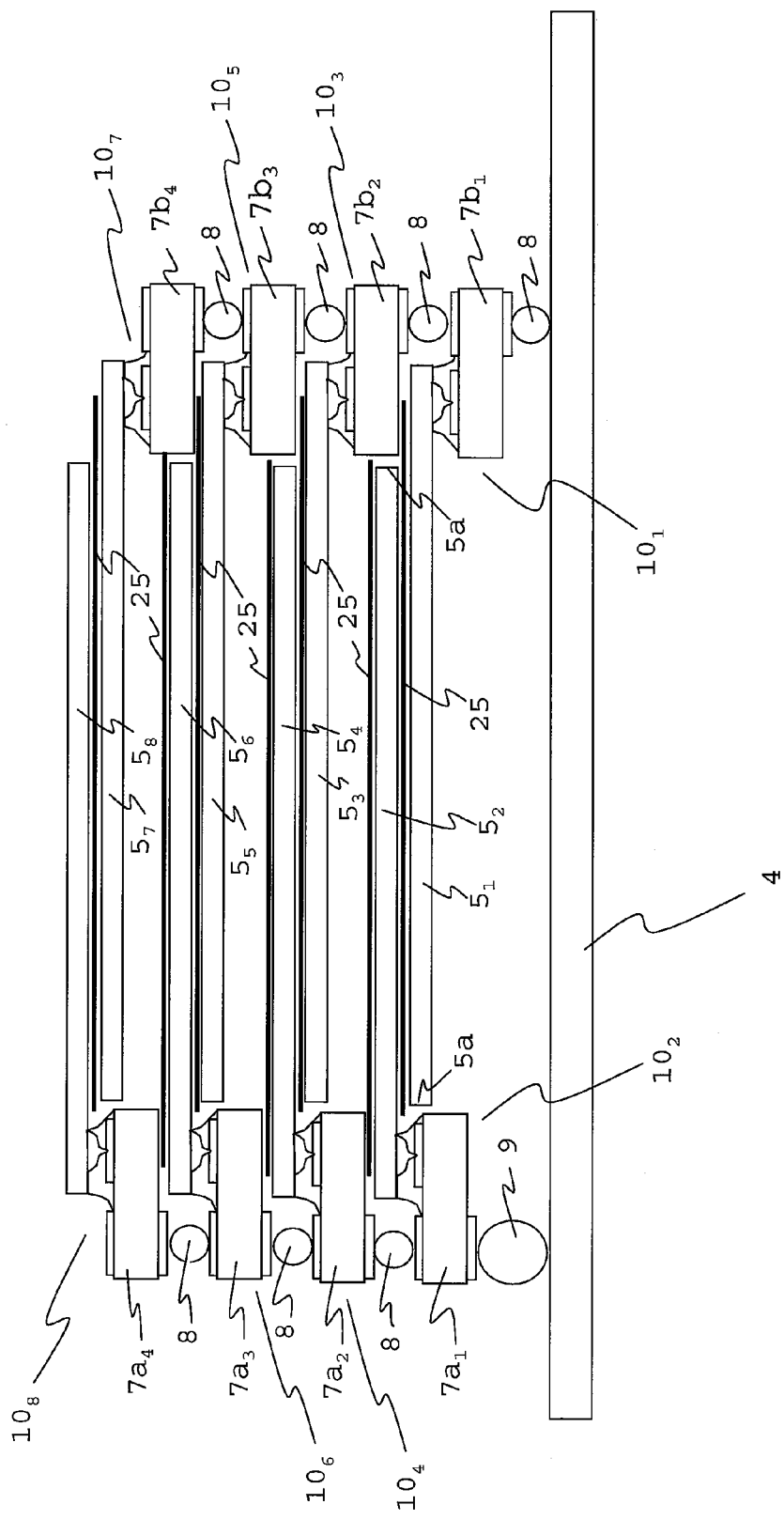
FIG. 6 is a front sectional view of the stacked module 6 according to the first embodiment.

FIG. 6 is a front sectional view of the stacked module 6. In the stacked module 6, the substrates 7, at left ends of which the semiconductor chips 5 are mounted, are substrates 7a. The substrates 7, at right ends of which the semiconductor chips 5 are mounted, are substrates 7b. Four substrates 7a and four substrates 7b are stacked in the vertical direction. The four substrates 7a are electrically connected vertically to one another by the solder balls 8 and four substrates 7b are also electrically connected in the exactly same way. The substrate 7b arranged at the bottom and the mother board 4 are electrically connected by the solder ball 8. The substrate 7a at the bottom and the mother board 4 are electrically connected by the solder ball 9 having a diameter larger than that of the solder balls 8.

For explanation, a reference sign of the semiconductor chip 5 arranged on the lowermost side is set as $5_1$ and a reference sign of the semiconductor chip 5 arranged second from the bottom is set as $5_2$. Similarly, reference signs of the third to eight semiconductor chips 5 from the bottom are set as $5_3$ to $5_8$. Concerning the substrates 7a and 7b, reference signs of the first substrates from the bottom are set as $7a_1$ and $7b_1$ and reference signs of the second substrates from the bottom are set as $7a_2$ and $7b_2$. Similarly, reference signs of the third and fourth substrates from the bottom are set as $7a_3$, $7b_3$, $7a_4$, and $7b_4$. Moreover, the modules 10 are set as modules $10_1$ to $10_8$ in order from the bottom.

When the members are set in this way, the semiconductor chip $5_1$ is mounted on the substrate $7b_1$ in the module $10_1$ first from the bottom and the semiconductor chip $5_2$ is mounted on the substrate $7a_1$ in the module $10_2$ second from the bottom. The semiconductor chip $5_3$ is mounted on the substrate $7b_2$ in the module $10_3$ third from the bottom and the semiconductor chip $5_4$ is mounted on the substrate $7a_2$ in the module $10_4$ fourth from the bottom. The semiconductor chip $5_5$ is mounted on the substrate $7b_3$ in the module $10_5$, the semiconductor chip $5_6$ is mounted on the substrate $7a_3$ in the module $10_6$, the semiconductor chip $5_7$ is mounted on the substrate $7b_4$ in the module $10_7$, and the semiconductor chip $5_8$ is mounted on the substrate $7a_4$ in the module 108. The respective substrates are arranged upward in order of the substrates $7b_1$, $7a_1$, $7b_2$, $7a_2$, $7b_3$, $7a_3$, $7b_4$, and $7a_4$ from the mother board 4 side.

For explanation, FIGS. 7A and 7B are front sectional view of the simplified modules $10_1$ to $10_4$ excluding insulating sheets 25 described later from the structure shown in FIG. 5. An alternate long and two short dashes line on an upper side of two alternate long and two short dashes lines shown in FIG. 7A indicates a surface L including a lower surface 5b of the semiconductor chip $5_2$. A long and two short dashes line on a lower side indicates a surface M including the lower surface 16 of the substrate $7b_1$.

As shown in FIG. 7A, a distal end 5a of the semiconductor chip $5_1$ is opposed to an inner side facet 70 of the substrate $7a_1$ and an inner surface 500 of the connecting section 50 at a predetermined space apart therefrom. The semiconductor chip $5_1$ is arranged in a space 17 formed by the inner side facet 70, the inner side surface 500, and the surfaces L and M. In other words, the module $10_1$ is arranged to partially overlap the space 17 formed by the module $10_2$ above the module $10_1$.

As shown in FIG. 7B, in the module $10_2$, the distal end 5a of the semiconductor chip $5_2$ is opposed to the inner side facet 70 of the substrate $7b_2$ and the inner side surface 500 of the connecting section 50 at the predetermined space apart therefrom. The semiconductor chip $5_2$ is arranged in a space 17' formed by the inner side facet 70, the inner side surface 500, and surfaces L' and M'. The remaining modules 10 are also arranged to keep the same positional relation as the modules arranged on an upper side thereof.

As shown in FIGS. 2 to 4 and FIG. 6, the insulating sheets 25 are provided on the upper surfaces of the semiconductor chips 5 in order to prevent the semiconductor chips 5 from becoming conductive to the semiconductor chips on the upper sides thereof. Referring to FIG. 6, the insulating sheet 25 placed on the upper surface of the semiconductor chip $5_1$ projects further to an outer side (in a left direction in the figure) than the distal end 5a of the semiconductor chip $5_1$ and projects further to an outer side (a right direction in the figure) than the distal end $5a_2$ of the semiconductor chip $5_2$. In this way, the insulating sheet 25 having an area larger than an area in which the semiconductor chips 5 arranged to be vertically adjacent to each other overlap is provided.

As described above, in the stacked structure of semiconductor chips according to the first embodiment, the semiconductor chip 5 as a part of the module 10 can be arranged in the space 17. On the other hand, in the stacked structure of the prior art, since the substrate 107 is arranged in the position of the space 17, a part of the module 10 cannot be arranged in the space 17.

Therefore, since the height of the stacked structure employing the first embodiment can be reduced compared with the structure of the prior art, it is possible to increase the number of stacked semiconductors and realize an increase in a capacity an SD memory card. In the structure according to the first embodiment, it is possible to create an SD memory card with a capacity of about 4G in total of the stacked modules 6 and 6' by using semiconductor chips with a capacity of 256M as the semiconductor chips 5.

A tabular holding member according to the present invention is equivalent to, for example, the substrate 7 according to this embodiment. Two holding members according to the present invention are equivalent to, for example, the substrates 7a and 7b according to this embodiment. An example of one holding member is equivalent to the substrate 7b and an example of the other holding member is equivalent to the substrate 7a. An example of one semiconductor chip according to the present invention is equivalent to the semiconductor chip 5 held on the substrate 7b according to this embodiment. An example of the other semiconductor chip according to the present invention is equivalent to the semiconductor chip 5 held on the substrate 7a according to this embodiment.

An example of one surface of the holding member according to the present invention is equivalent to the upper surface 15 of the substrate 7 according to this embodiment. An example of the other surface of the holding member according to the present invention is equivalent to the lower surface 16 of the substrate 7 according to this embodiment. An example of "a surface including a surface on an opposite side of the other semiconductor chip side of the other holding member" according to the present invention is equivalent to the surface M including the lower surface 16 of the substrate $7a_1$ shown in FIG. 7A. An example of "a surface including a surface on the holding member side of the other semiconductor chip" is equivalent to the surface L including the lower surface 5b of the semiconductor chip $5_2$ shown in FIG. 7A.

An example of "a surface including a surface on an opposite side of the one semiconductor chip side of the one holding member" according to the present invention is equivalent to the surface M' including the lower surface 16 of the substrate $7b_1$ shown in FIG. 7B. An example of "a surface including a surface on the one holding member side of the one semiconductor chip" according to the present invention is equivalent to the surface L' including the lower surface of the semiconductor chip $5_3$ shown in FIG. 7B.

Figure 8A:
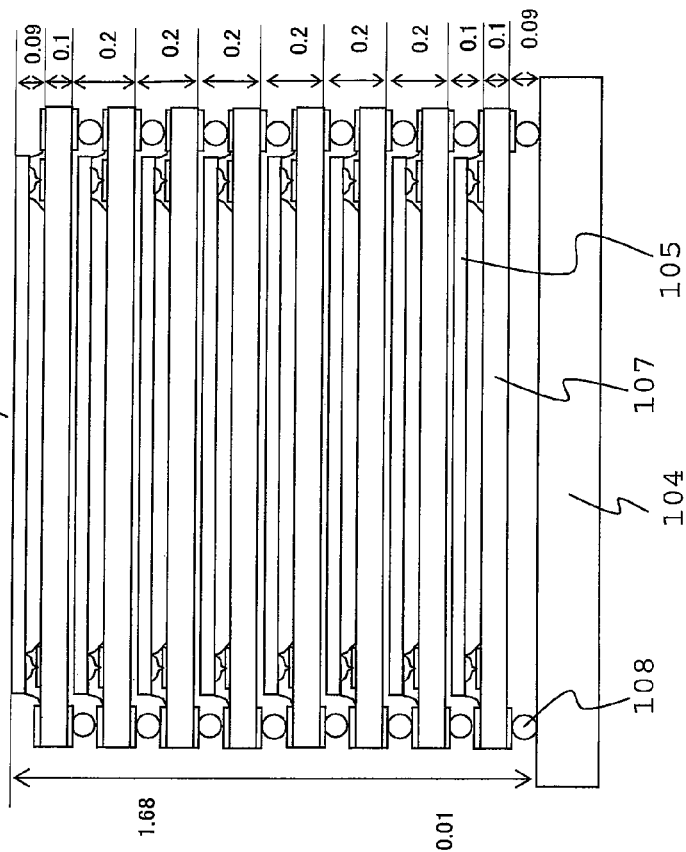
FIG. 8A is a front sectional view of the stacked module 6 according to the first embodiment.
Figure 8B:
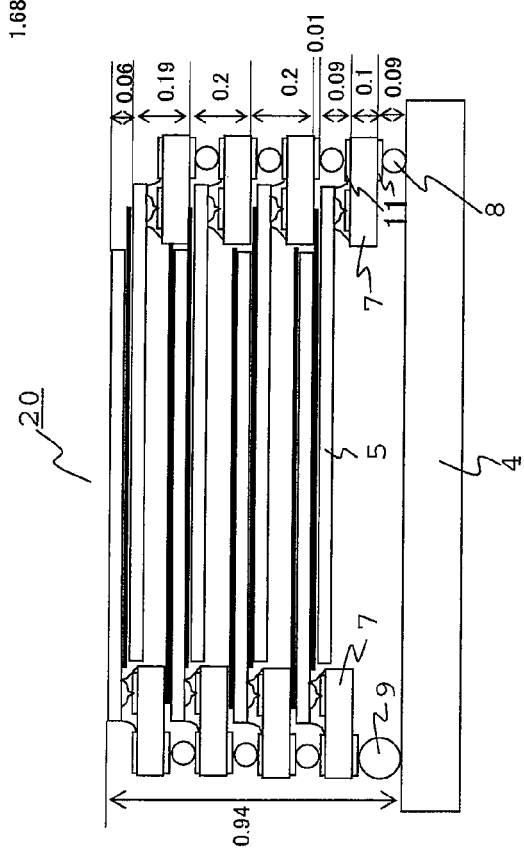
FIG. 8B is a front sectional view of a stacked module 120 having a structure used in the past.
Figure 23:
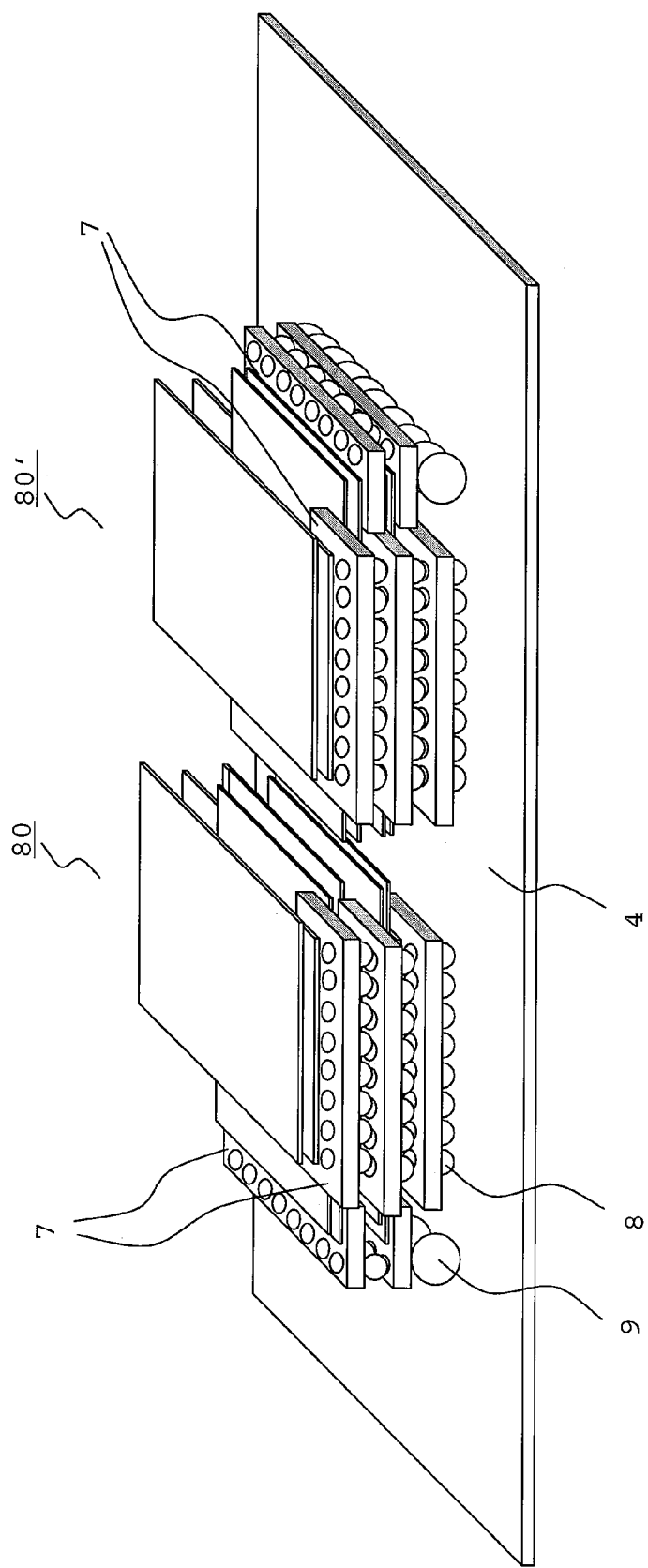
FIG. 23 is a rear perspective view of the stacked modules 80 and 80' according to the fourth embodiment of the present invention.

Specifically, the height of the stacked structure of the prior art shown in FIG. 23 and the height of the stacked structure according to the first embodiment are compared. FIG. 8A is a sectional view showing the stacked structure according to the first embodiment. FIG. 8A shows the same stacked module 6 as shown in FIG. 3. FIG. 8B is a sectional view showing a stacked module 120 in a state in which eight semiconductor chips are stacked using the stacked structure of the prior art.

The thickness of the substrates 7 and 107 is set to 0.1 mm, the thickness of the semiconductor chips 5 and 105 is set to 0.05 mm, the height from the upper surfaces of the substrates 7 and 107 to the lower surfaces of the semiconductor chips 5 and 105 mounted on the substrates 7 and 107 is set to 0.04 mm, the height from the upper surfaces of the semiconductor chips 5 and 105 to the lower surfaces of the substrates 7 and 107 arranged on the upper side of the semiconductor chips 5 and 105 is set to 0.01 mm, the height of the lands for ball 11 and 111 is set to 0.01 mm, the thickness of the insulating sheets 25 is set to 0.01 mm, and the height of the solder balls 8 and 108 is set to 0.08 mm. Under these conditions, the height of the stacked structure of the prior art and the height of the stacked structure according to the first embodiment are compared.

The height of the stacked module 6 shown in FIG. 8A is 0.94 mm. On the other hand, the height of the stacked module 120 formed by the stacked structure of the prior art shown in FIG. 8B is 1.68 mm.

In the SD memory card 1 shown in FIG. 1, the thickness in the inside thereof is about 1.2 mm. Therefore, it is possible to store the stacked modules 6 and 6' according to the first embodiment in the SD memory card 1.

In this way, in the stacked structure of semiconductor chips according to this embodiment, when the semiconductor chips in the same number as that in the prior art are stacked, it is possible to reduce the height compared with the prior art. Therefore, the number of semiconductor chips 5 which can be stacked increases and it is possible to realize an increase in a capacity of the SD memory card 1.

A method of manufacturing a stacked structure of semiconductor chips according to this embodiment is performed according to respective steps described below. First, the semiconductor chips 5 are mounted on the substrates 7, whereby plural modules 10 are created. Thereafter, a jig is placed on the mother board 4. The module $10_1$ is mounted on the mother board 4 via the solder balls 8 and 9 by using the jig such that the semiconductor chip 5 of the module $10_1$ is horizontal to the mother board 4. Subsequently, the respective modules 10 are stacked and arranged on the mother board 4 via the solder balls 8 to obtain the structure shown in FIGS. 2 to 4. In this way, the process of stacking the substrates 7 and the semiconductor chips 5 is equivalent to an example of a stacking step according to the present invention. The substrates 7 and the semiconductor chips 5 may be separately stacked without creating the modules 10 in advance.

In the first embodiment, all of the stacked plural semiconductor chips 5 are mounted on the substrates 7 at one of the ends. However, as shown in FIG. 9, only a part of the semiconductor chips 5 may be mounted on the substrates 7 at the ends.

Figure 9:
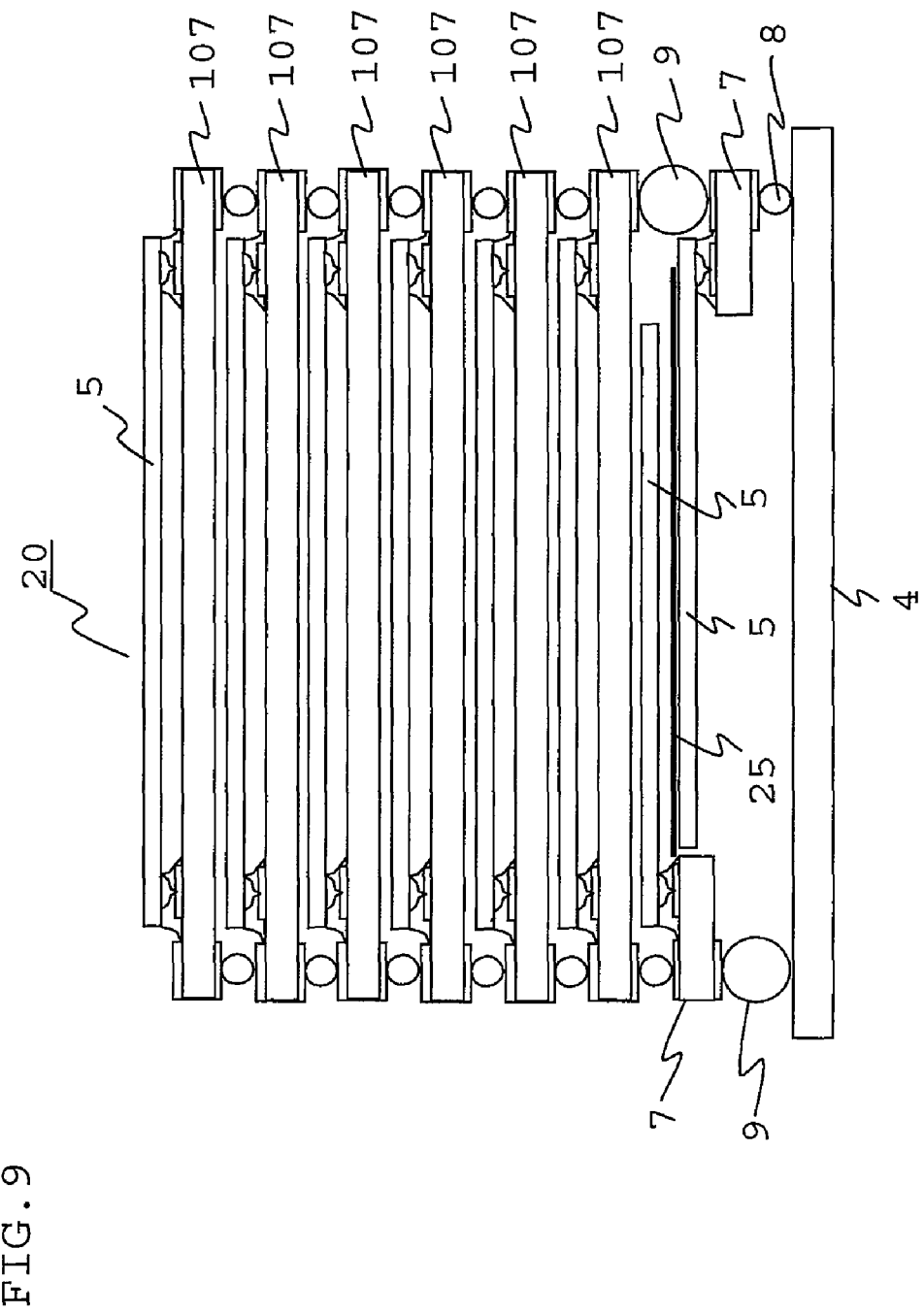
FIG. 9 is a front sectional view of a stacked module 20 according to a modification of the first embodiment.

In FIG. 9, the first and second semiconductor chips 5 counted from the mother board 4 side are mounted on and held by the substrates 7 provided on lower sides at the ends of the semiconductor chips 5. The other semiconductor chips 5 are held by the substrates 107 provided over the entire surfaces on the lower sides of the semiconductor chips 5. In such a stacked module 20, since a part of the module 10 at the bottom is arranged to overlap the space 17 formed by the module 10 arranged above the module 10, it is possible to reduce the height of the entire stacked module 20 compared with the stacked module 120 shown in FIG. 8B.

Figure 10:
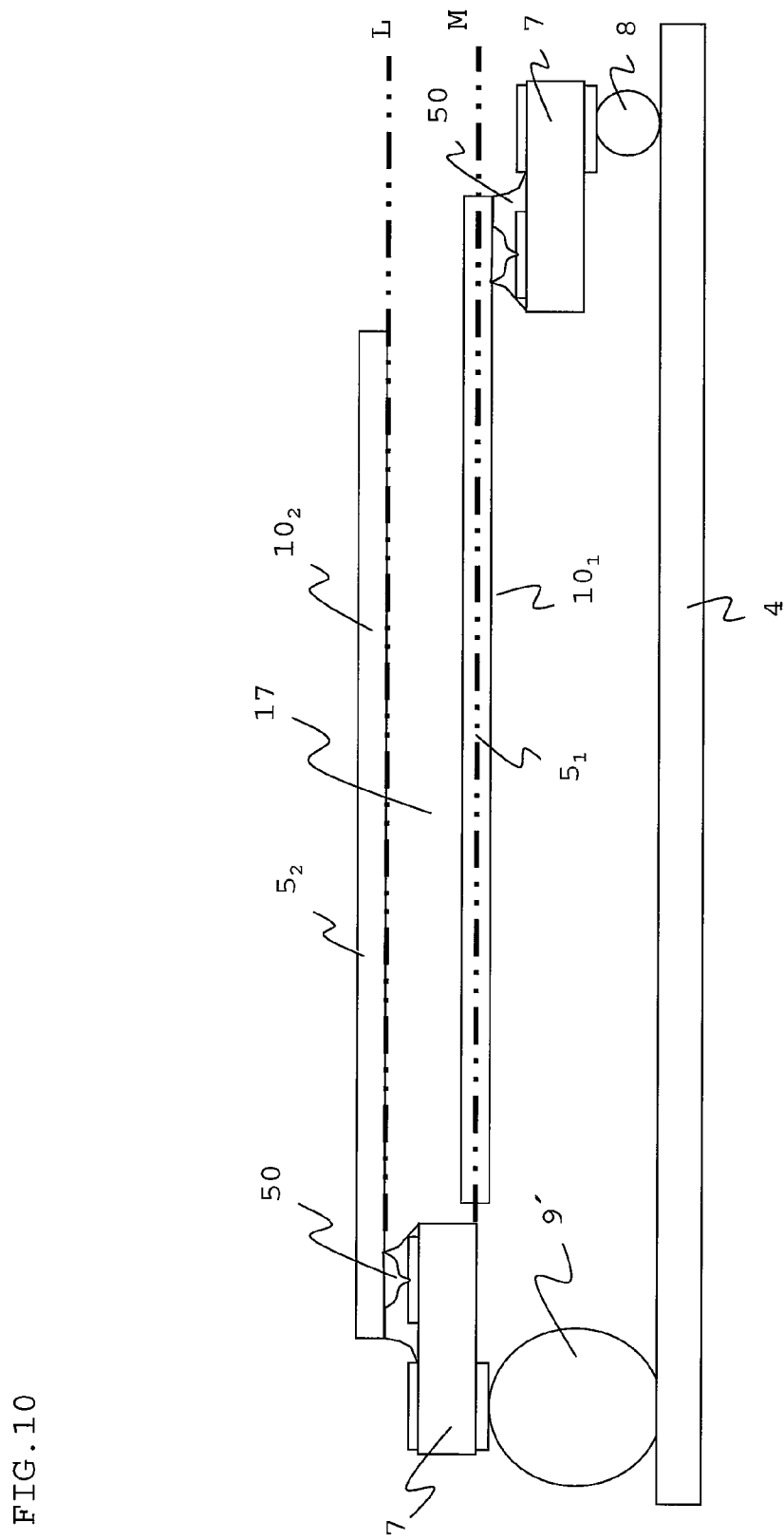
FIG. 10 is a diagram for explaining a modification of the arrangement of the module 10 according to the first embodiment.

As shown in FIG. 7, in this embodiment, if the module $10_1$ partially overlaps the space 17 formed by the module $10_2$ on the upper side, it is possible to reduce the height compared with the structure of the prior art. Therefore, as shown in FIG. 10, if at least a part of the semiconductor chip $5_1$ of the module $10_1$ is in the space 17 formed by the module $10_2$, it is possible to reduce the height compared with the stacked structure of the prior art. The height of the module $10_2$ can be changed according to a size of a solder ball 9'. In FIG. 10, only the two modules 10 are shown. However, the other modules 10 may be stacked.

Figure 11:
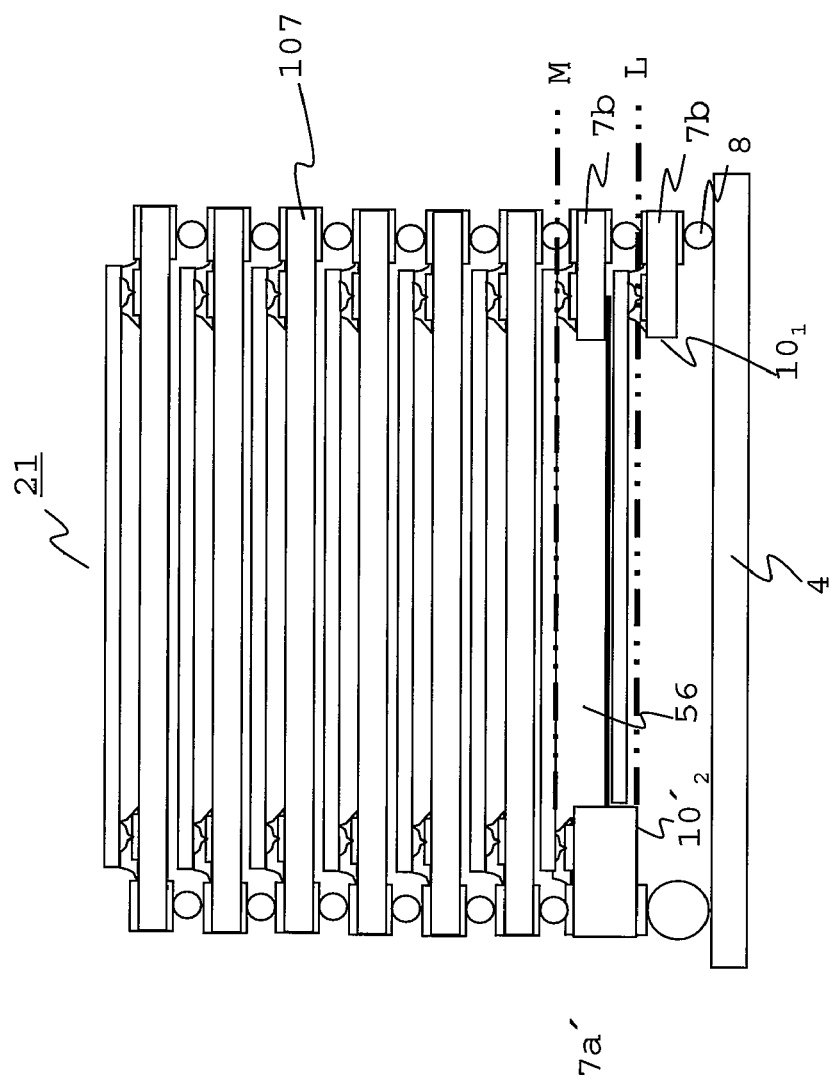
FIG. 11 is a front sectional view of a stacked module 21 according to a modification of the first embodiment.

When the substrate 7a and the substrate 7b having different thicknesses are used, the stacked structure shown in FIG. 11 may be adopted. One of the semiconductor chips 5 of a stacked module 21 shown in FIG. 11 is held at both ends thereof by a substrate 7a' and the substrate 7b and another one of the semiconductor chips 5 of the stacked module 21 is held only at one end by the substrate 7b. The other semiconductor chips 5 are held by the substrates 107. The substrate 7a' is formed to be thicker than the substrate 7b. In such a case, as shown in FIG. 11, the module $10_1$ is arranged such that a part of the module $10_1$ overlaps a space 56 formed by a module $10_2'$ which has the substrate 7a' and the semiconductor chip 5. Consequently, it is possible to reduce the height compared with the structure of the prior art.

Figure 12:
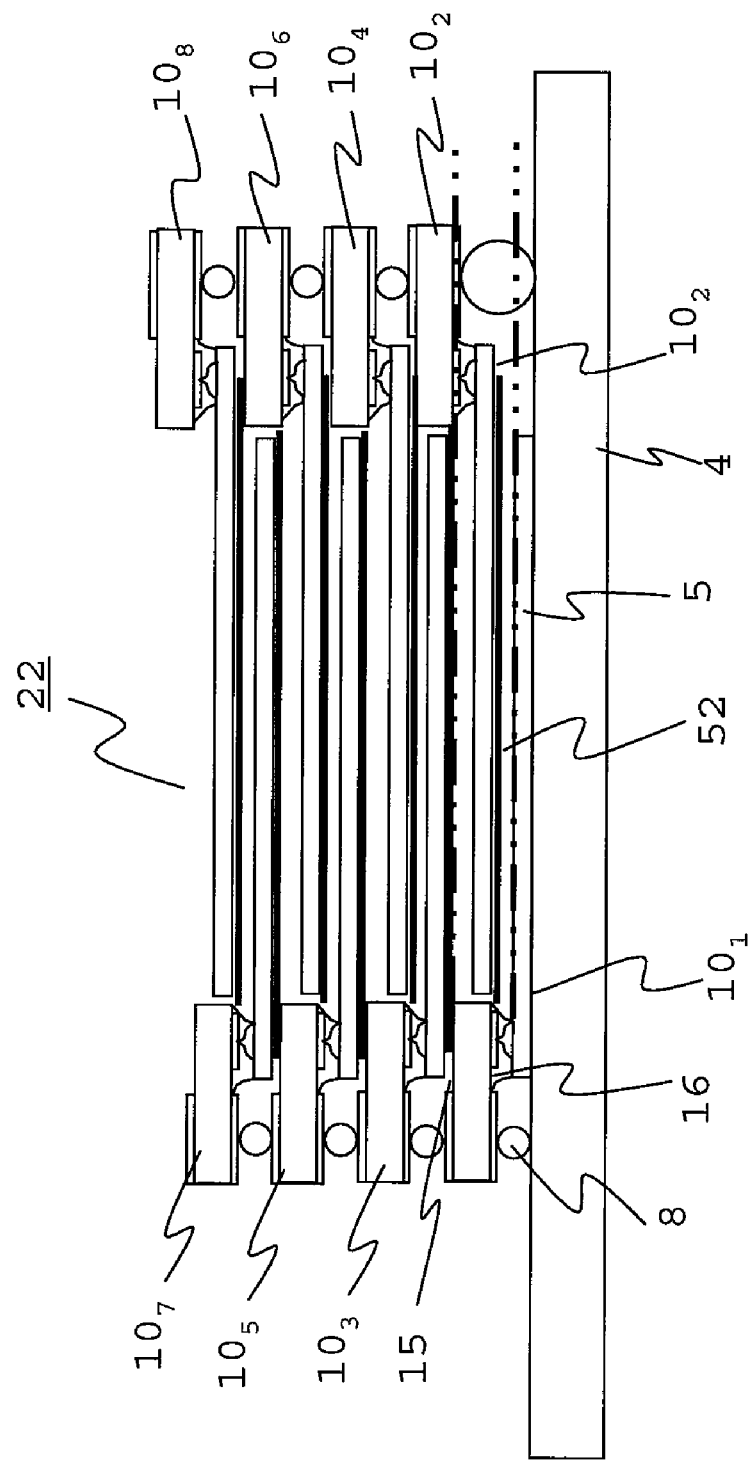
FIG. 12 is a front sectional view of a stacked module 22 according to a modification of the first embodiment.

In this embodiment, as shown in FIG. 3, the semiconductor chips 5 are mounted on the upper surfaces 15 of the substrates 7. However, as in a stacked module 22 shown in FIG. 12, the semiconductor chips 5 may be mounted on the lower surfaces 16 of the substrates 7. In this case, in the stacked module 22, a part of the module 10 is arranged in a space 52 formed by the module 10 on the lower side of the module 10.

Figure 13A:
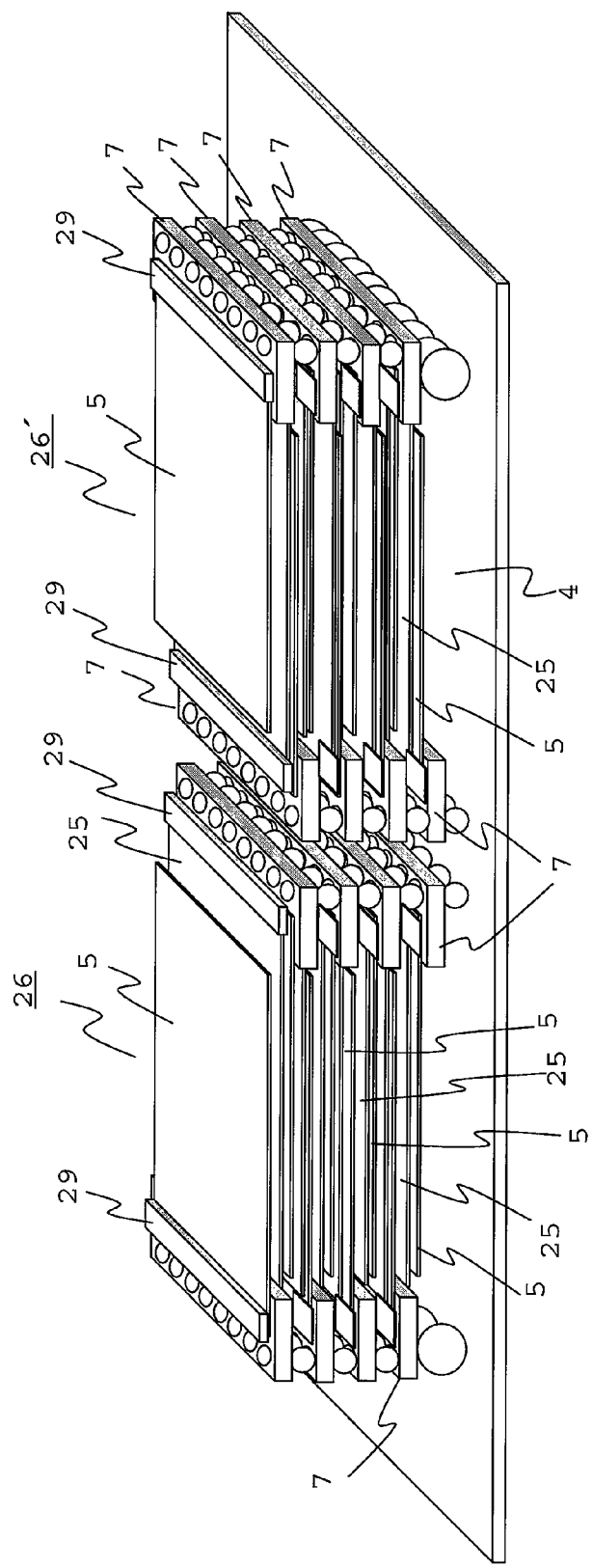
FIG. 13A is a perspective view of stacked modules 26 and 26' according to a modification of the first embodiment.
Figure 13B:
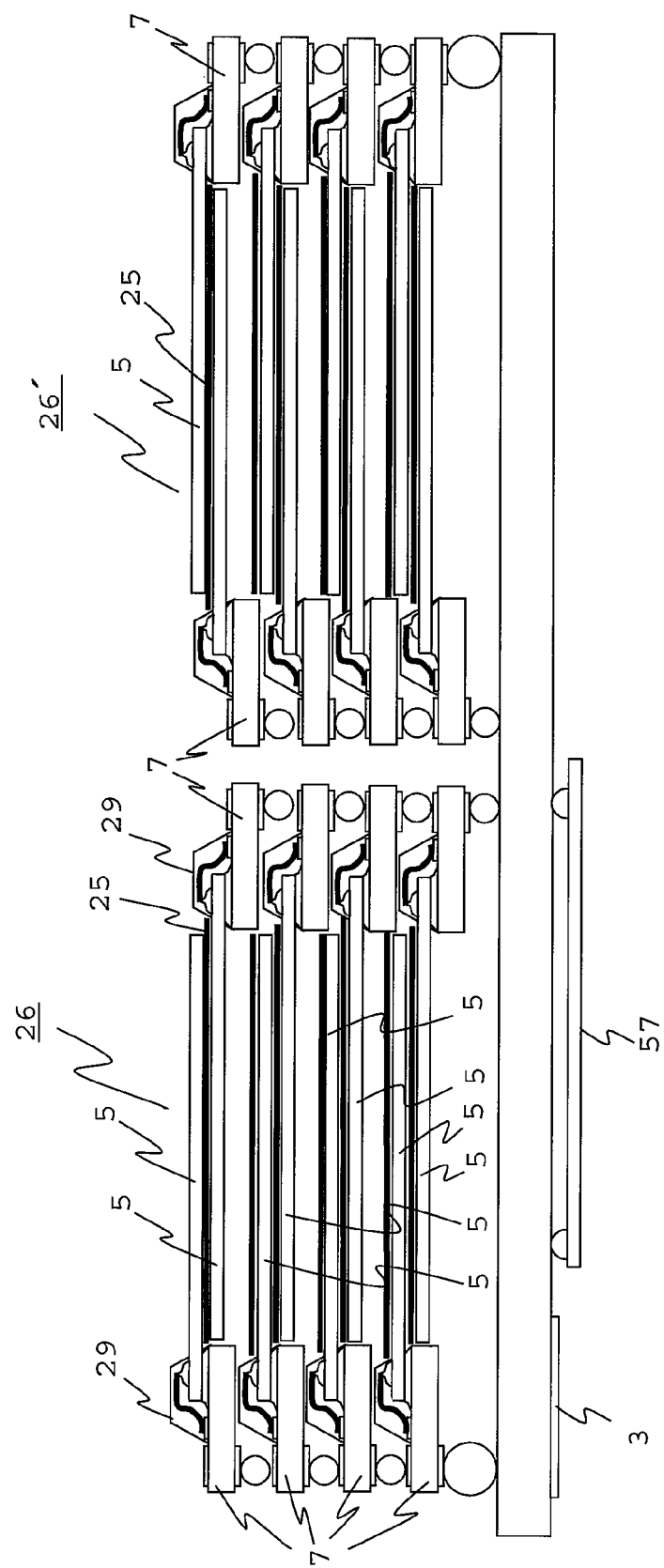
FIG. 13B is a front sectional view of the stacked modules 26 and 26' according to the modification of the first embodiment.
Figure 13C:
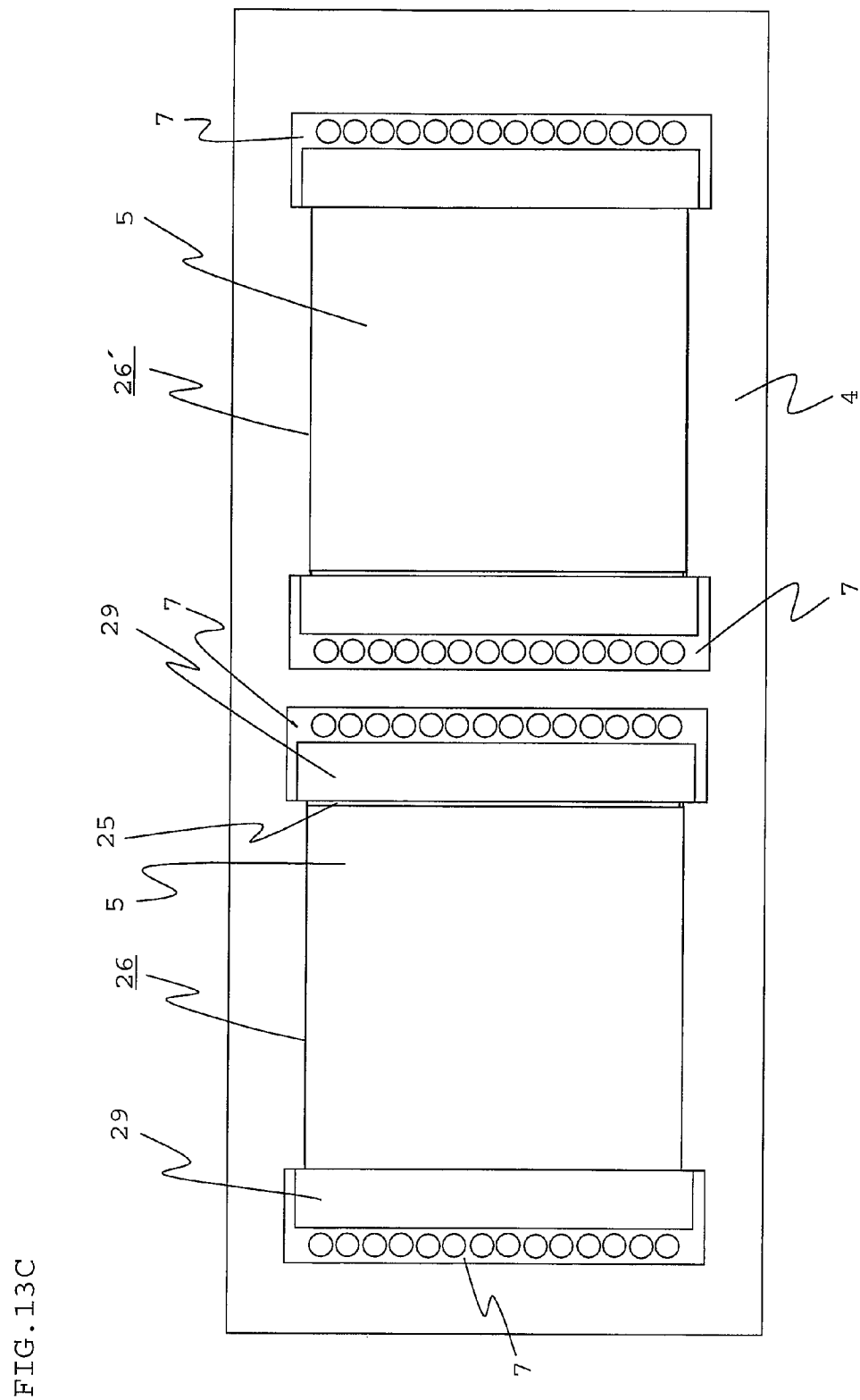
FIG. 13C is a plan view of the stacked modules 26 and 26' according to the modification of the first embodiment.
Figure 13D:
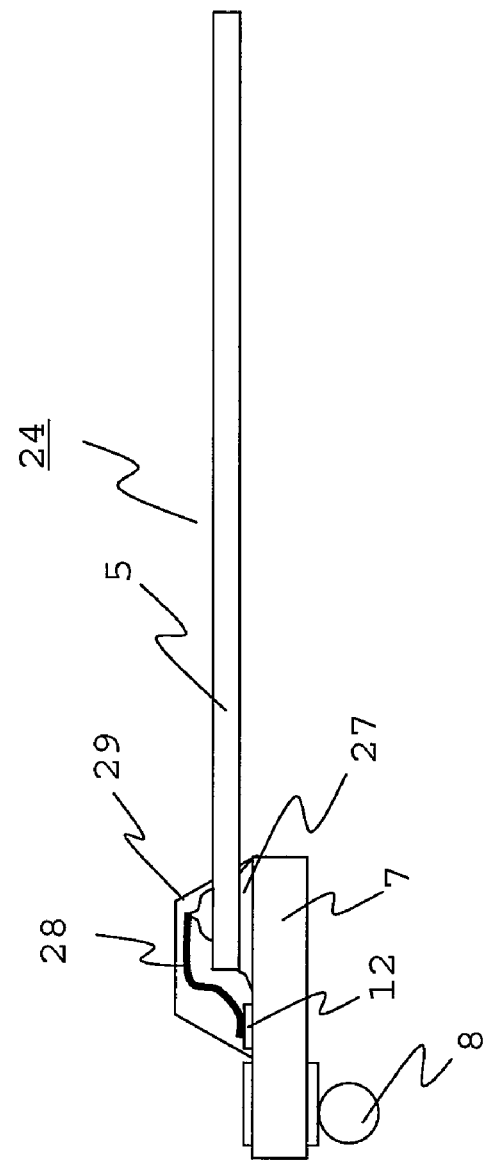
FIG. 13D is a front sectional view of a module 24 according to the modification of the first embodiment.

In the stacked modules 6 and 6' according to this embodiment, the semiconductor chips 5 are mounted on the substrates 7 by flip chip. However, as in stacked modules 26 and 26' shown in FIGS. 13A to 13D, the semiconductor chips 5 may be mounted on the substrates 7 by wire bonding. FIG. 13A is a perspective view of the stacked modules 26 and 26'. FIG. 13B is a front sectional view of the stacked modules 26 and 26'. FIG. 13C is a plan view of the stacked modules 26 and 26'. FIG. 13D is a sectional view of one module 24 including one substrate 7 and one semiconductor chip 5. As shown in FIG. 13D, the semiconductor chip 5 is held on the substrate 7 by a bonding material 27 formed of, for example, an Ag paste.

The substrate 7 and the semiconductor chip 5 are electrically connected by a bonding wire 28 formed by, for example, an Au wire. The bonding wire 28 is reinforced by sealing resin 29 and kept insulated.

In the first embodiment, as shown in FIG. 6, the insulating sheet 25 is formed in a size for projecting further to an outer side than the surface S including the distal end $5a$ of the semiconductor chip $5_1$ and the surface T including the distal end $5a$ of the semiconductor chip $5_2$ arranged above and below the insulating sheet 25. However, an insulating sheet may be an insulating sheet 25' of a size which is arranged only further on an inner side than the distal ends $5a_1$ and $5a_2$ as shown in FIG. 14.

In the above explanation, the number of stacked semiconductor chips in a stacked module can be changed as appropriate.

Second Embodiment

The stacked structure of semiconductor chips according to a second embodiment of the present invention is explained below. The stacked structure of semiconductor chips according to the second embodiment is the same as the stacked structure according to the first embodiment in the basic structure but is different from the stacked structure according to the first embodiment in that the semiconductor chips 5 are mounted on both the sides of the substrate 7. Therefore, the difference is mainly explained and explanation of the respective members is omitted.

Figure 15:
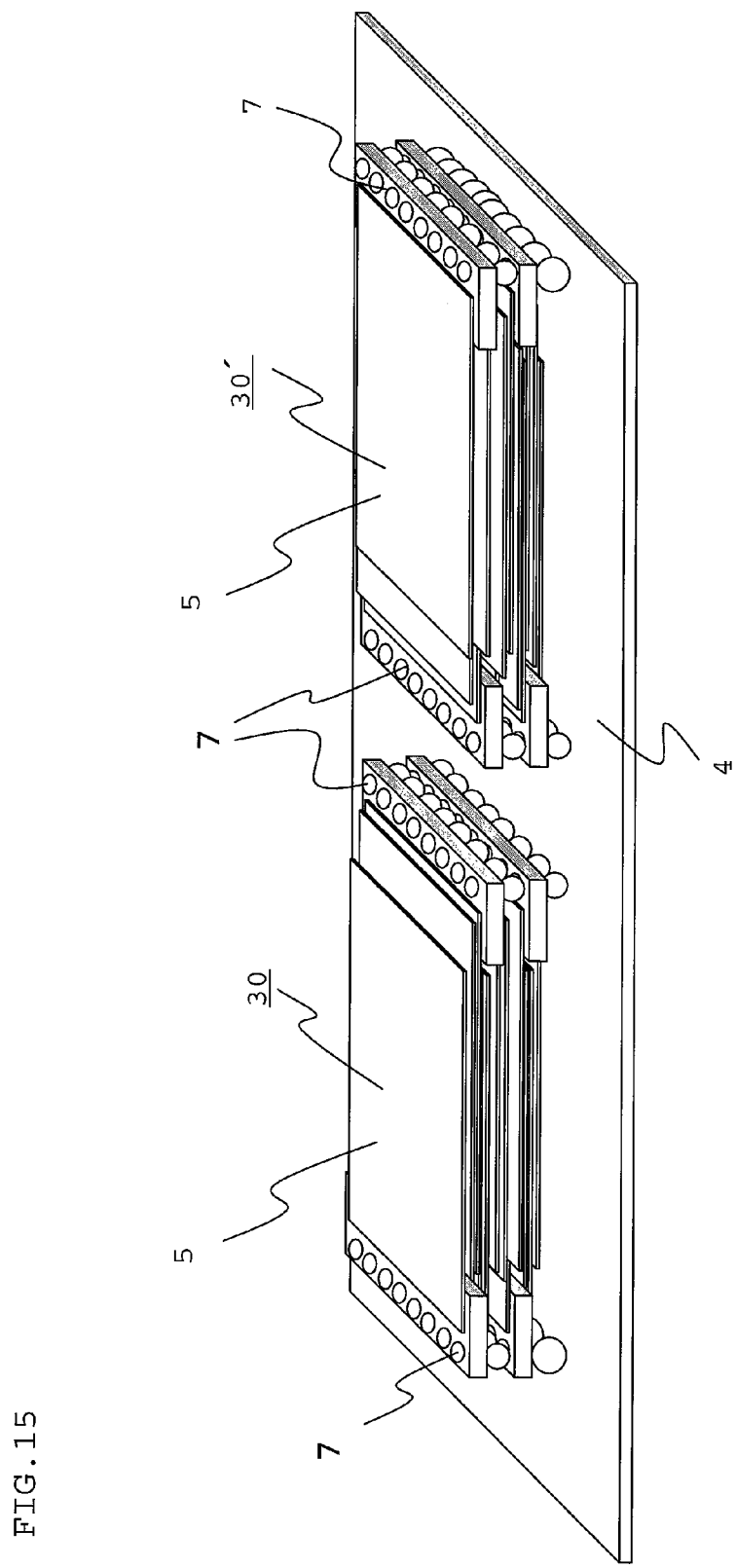
FIG. 15 is a perspective view of stacked modules 30 and 30' according to a second embodiment of the present invention.
Figure 16:
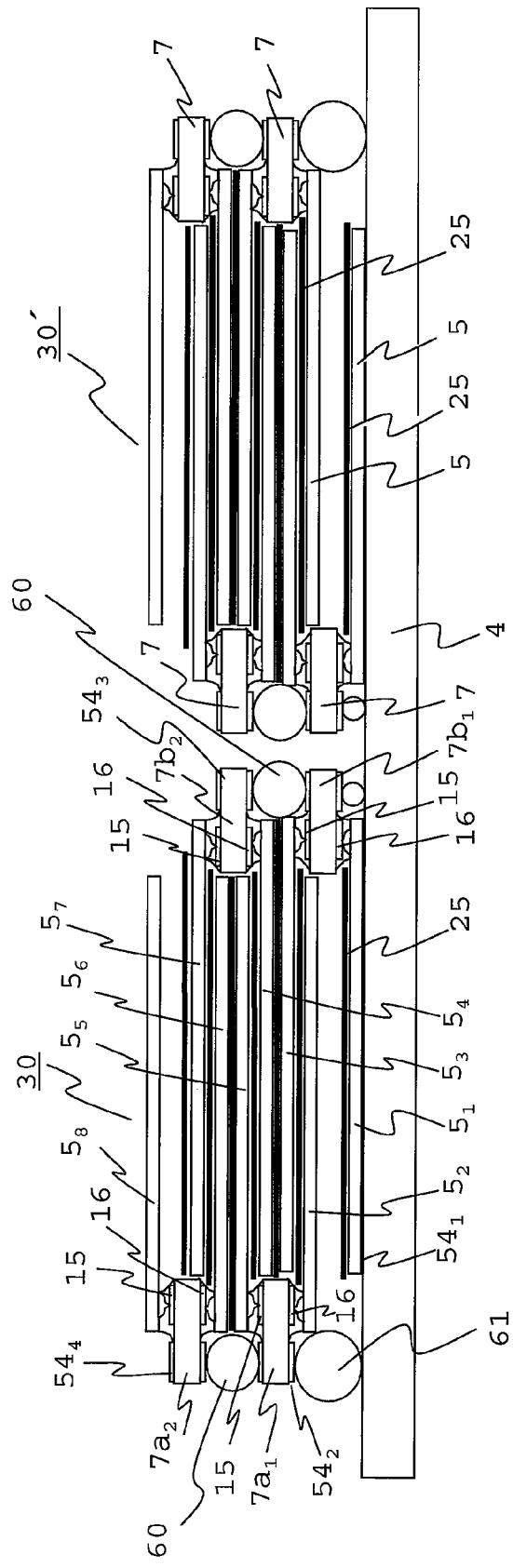
FIG. 16 is a front sectional view of the stacked modules 30 and 30' according to the second embodiment.
Figure 17:
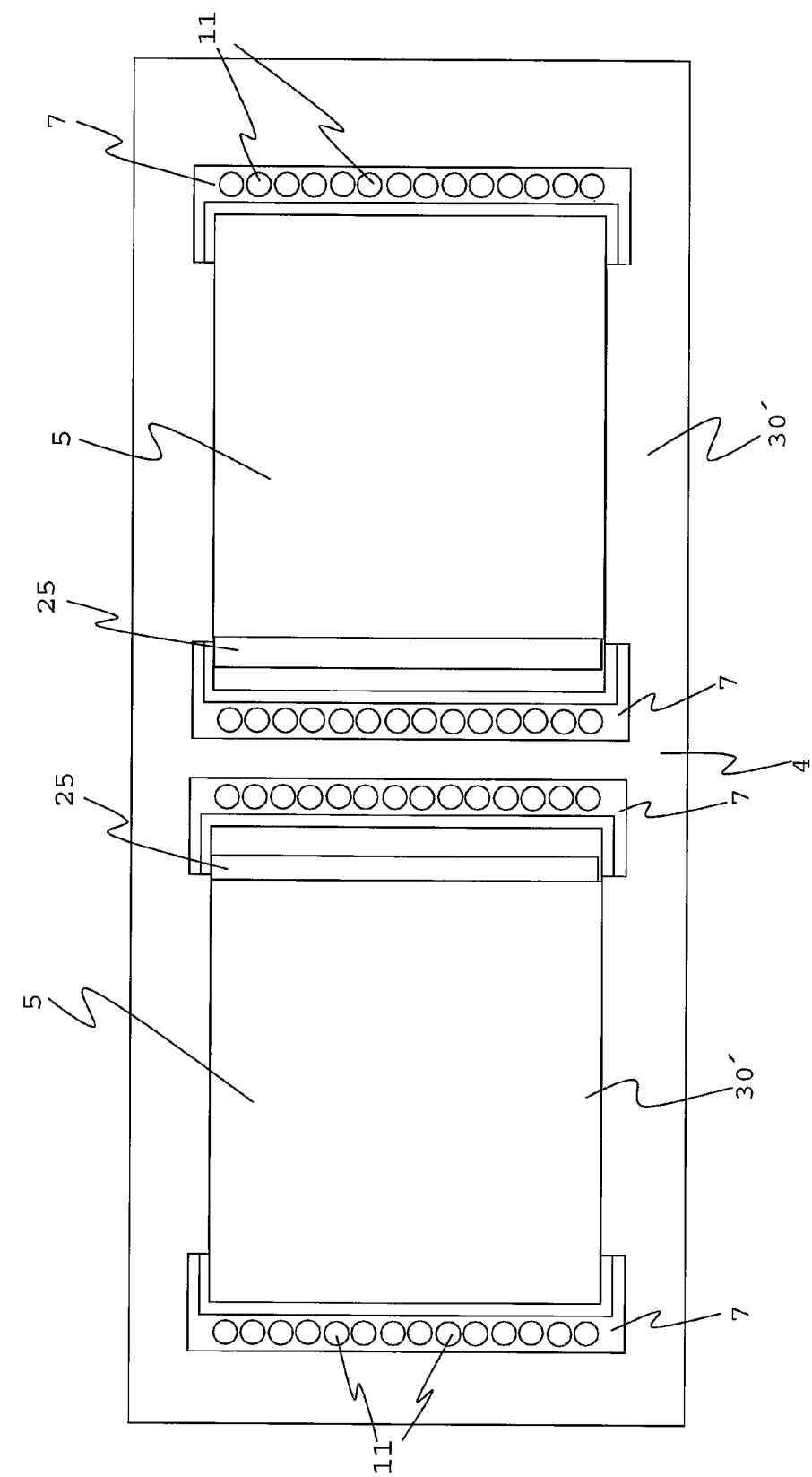
FIG. 17 is a plan view of the stacked modules 30 and 30' according to the second embodiment.

FIG. 15 is a perspective view of stacked modules 30 and 30' according to the second embodiment. FIG. 16 is a front sectional view of the stacked modules 30 and 30' according to the second embodiment. FIG. 17 is a plan view of the stacked modules 30 and 30' according to the second embodiment.

Since the stacked module 30' is arranged to be symmetrical to the stacked module 30, only the structure of the stacked module 30 is explained below.

Figure 18:
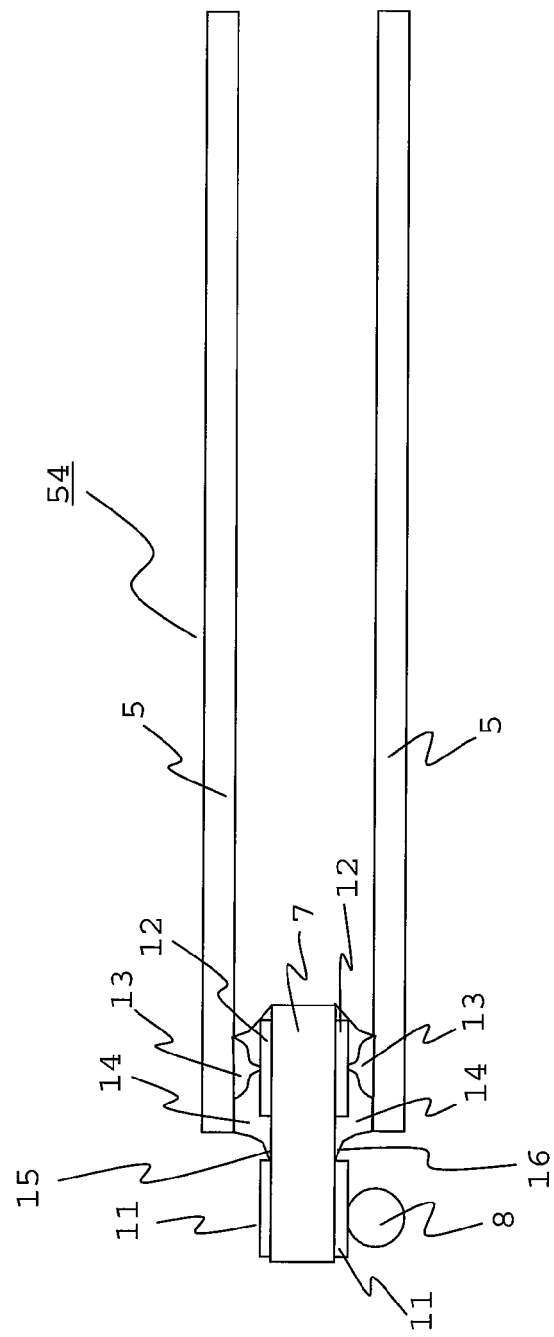
FIG. 18 is a front sectional view of a module 54 according to the second embodiment.

As shown in FIGS. 15 to 17, in the stacked module 30 according to the second embodiment, unlike the stacked module 6 according to the first embodiment, two substrates 7 are arranged on each of the left and right in the figure. The semiconductor chips 5 are mounted on the upper and lower surfaces of the substrate 7. One module 54 is formed by the substrate 7 and the semiconductor chips 5 above and below the substrate 7. FIG. 18 is a front sectional view showing the structure of the one module 54. The semiconductor chip 5 is mounted on the upper surface 15 of the substrate 7 by flip chip in the same manner as the first embodiment. The semiconductor chip 5 is mounted on the lower surface 16 of the substrate 7 by flip chip in the same manner as the mounting on the upper surface 15. Since eight semiconductor chips 5 are stacked in the stacked module 30 according to the second embodiment, the stacked module 30 has four modules 54.

The arrangement of the respective modules 54 is explained.

As shown in FIG. 16, in the stacked module 30, the semiconductor chip $5_1$ arranged at the bottom is mounted on the lower surface 16 of the substrate $7b_1$ on the right side. The semiconductor chip $5_2$ second from the bottom is mounted on the lower surface 16 of the substrate $7a_1$ on the left side. The semiconductor chip $5_3$ third from the bottom is mounted on the upper surface 15 of the substrate $7_{b1}$ on the right side. The semiconductor chip $5_4$ fourth from the bottom is mounted on the lower surface 16 of the substrate $7b_2$ on the right side. The semiconductor chip $5_5$ fifth from the bottom is mounted on the upper surface 15 of the substrate $7a_1$ on the left side. The semiconductor chip $5_6$ sixth from the bottom is mounted on the lower surface 16 of the substrate $7a_2$ on the left side. The semiconductor chip $5_7$ seventh from the bottom is mounted on the upper surface 15 of the substrate $7b_2$ on the right side. The semiconductor chip $5_8$ eighth from the bottom is mounted on the upper surface 15 of the substrate $7b_2$ on the left side. The insulating sheets 25 are arranged between the respective semiconductor chips 5. A size of the solder ball 8 between the substrate $7b_1$ and the mother board 4 is determined such that the semiconductor chip $5_1$ is placed on the surface of the mother board 4. The substrate $7b_1$ and the substrate $7b_2$ are electrically connected and the substrate $7a_1$ and the substrate $7a_2$ are electrically connected by solder balls 60 having a diameter different from that of the solder ball 8. The substrate $7a_1$ and the mother board 4 are electrically connected by a solder ball 61, a diameter of which is adjusted to satisfy the relation described above.

As in the first embodiment, the modules and the semiconductor chips are explained in order from the mother board 4 side with respect to the positions of the substrates 7 of the respective modules and with reference signs suffixed thereto. Two semiconductor chips 5, i.e., the semiconductor chip $5_3$ of a module $54_1$ and the semiconductor chip $5_4$ of a module $54_3$ are arranged between the semiconductor chips $5_2$ and $5_5$ of a module $54_2$. Similarly, two semiconductor chips 5, i.e., the semiconductor chip $5_5$ of the module $54_2$ and the semiconductor chip $5_6$ of a module $54_4$ are arranged between the semiconductor chips $5_4$ and $5_7$ of the module $54_3$.

The modules $54_1$ and $54_2$ are explained more in detail as an example.

Figure 19:
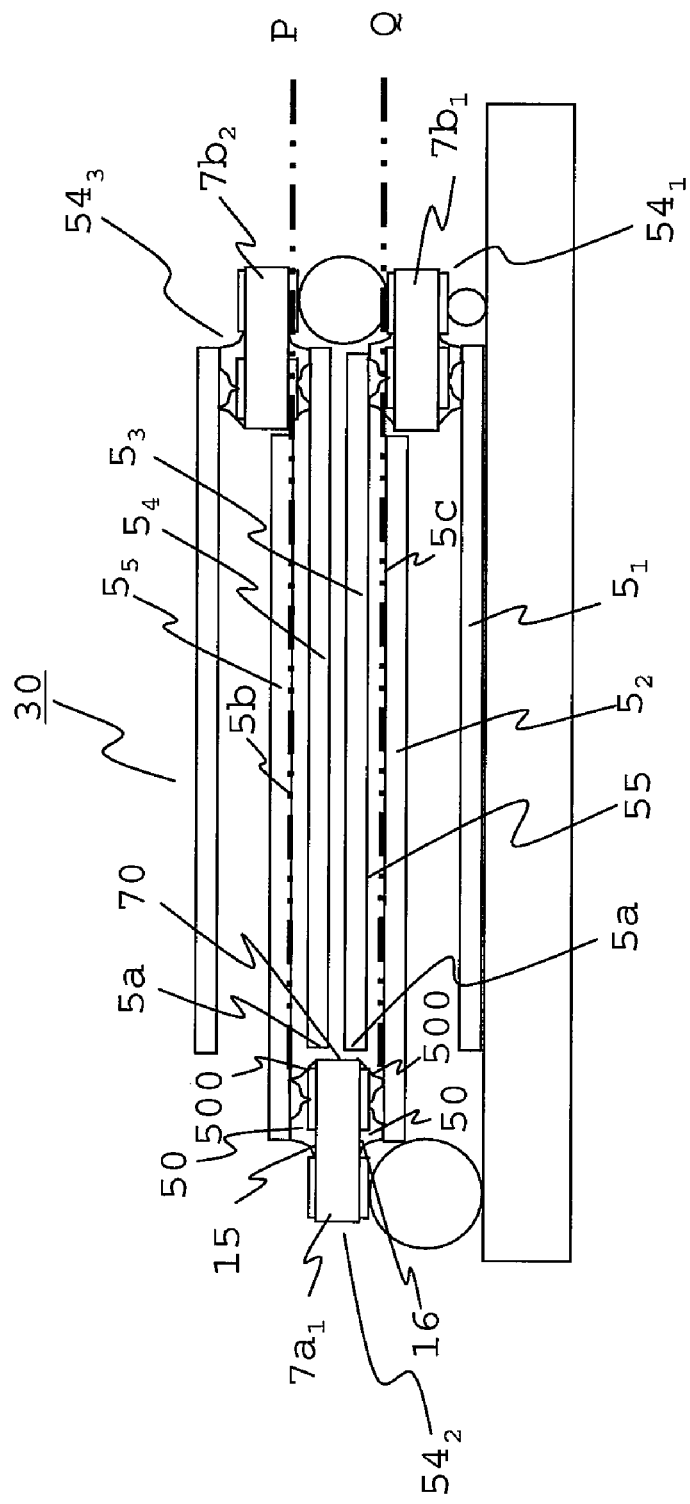
FIG. 19 is a front sectional view of the stacked modules 30 according to the second embodiment.

FIG. 19 is a diagram showing part of the structure of the stacked module 30 from which the insulating sheets 25 are removed for simplification of explanation. The respective distal ends $5a$ of the semiconductor chips $5_3$ and $5_4$ are arranged so that respective distal ends $5a$ are opposed to the inner side facet 70 of the substrate $7a_1$ and the inner side surfaces 500 of the upper and lower connecting sections 50 and to partially overlap a space formed by a surface P including the lower surface $5b$ of the semiconductor chip 55, a surface Q including the upper surface $5c$ of the semiconductor chip $5_2$, the inner side facet 70 and the inner side surface 500 (see an alternate long and two short dashes line in the figure). In other words, the upper and lower modules $54_1$ and $54_3$ are arranged to overlap each other in the space 55 formed by the module $54_2$. Similarly, the upper and lower modules $54_2$ and $54_4$ are arranged to overlap each other in the space 55 formed by the module $54_3$. However, the module $54_4$ is not shown in FIG. 19.

The module $54_2$ is arranged in the space 55 formed by the module $54_1$ to partially overlap the space 55. The module $54_3$ is arranged in a space formed by the module $54_4$ not shown in the figure to partially overlap the space.

As described above, in the stacked structure of semiconductor chips according to the second embodiment, it is possible arrange a part of the module 54 in the space 55. On the other hand, in the stacked structure of the prior art, since the substrate 107 is arranged in the position of the space 55, a part of the module 54 cannot be arranged in the space 55.

Therefore, since it is possible to reduce the height compared with the structure of the prior art, it is possible to increase the number of stacked semiconductor chips and realize an increase in a capacity the SD memory card.

"A surface including a surface on the holding member side of the semiconductor chip held on one surface of the other holding member" according to the present invention is equivalent to, for example, the surface P including the lower surface $5b$ of the semiconductor chip $5_5$ according to this embodiment shown in FIG. 19. "A surface including a surface on the holding member side of the semiconductor chip held on the other surface of the other holding member" according to the present invention is equivalent to, for example, the upper surface Q of the semiconductor chip $5_2$ according to this embodiment shown in FIG. 19. "One semiconductor chip of semiconductor chips held on both the sides of the one holding member" according to the present invention is equivalent to, for example, the semiconductor chip $5_3$ according to this embodiment shown in FIG. 19. "One holding member adjacent to the one holding member" according to the present invention is equivalent to, for example, the substrate $7b_2$ adjacent to the substrate $7b_1$ in this embodiment. "One semiconductor chip of semiconductor chips held on both the surfaces by one holding member adjacent to the one holding member" according to the present invention is equivalent to, for example, the semiconductor chip $5_4$ according to this embodiment.

Figure 20:
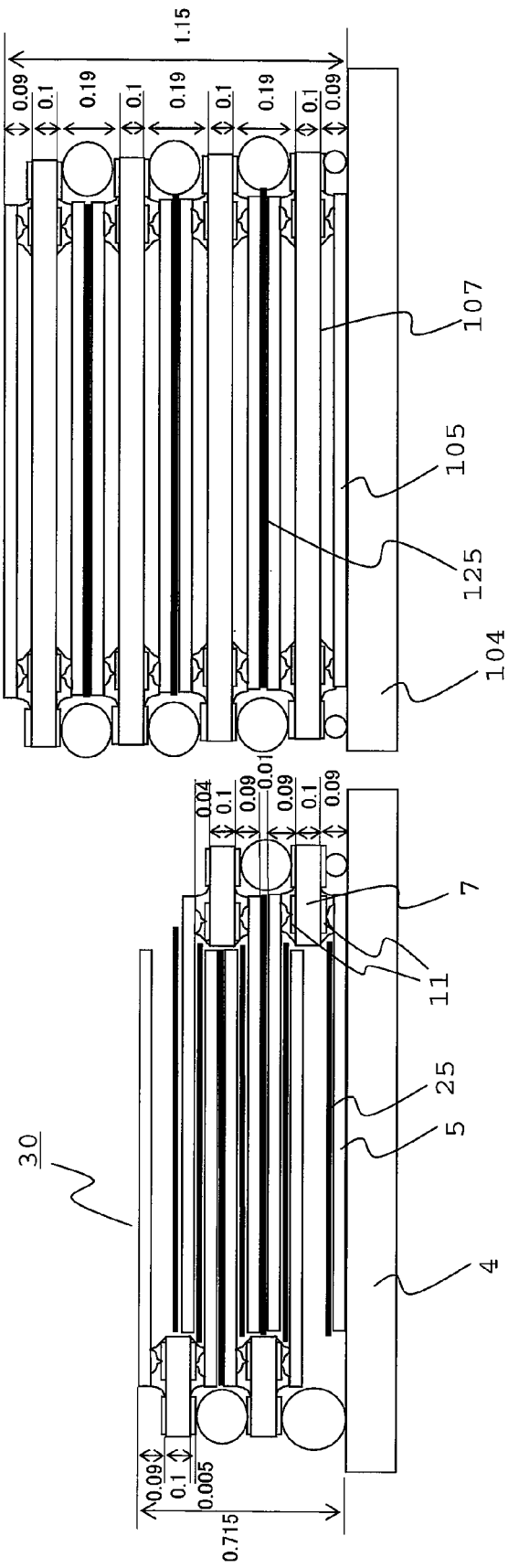
FIG. 20A is a front sectional view of the stacked module 30 according to the second embodiment.
FIG. 20B is a front sectional view of a stacked module 130 having a structure of the prior art.

Specifically, the height of a stacked module employing the stacked structure of the prior art shown in FIG. 20B and the height of the stacked module 30 according to the second embodiment shown in FIG. 20A are compared. FIG. 20A is a front sectional view showing the stacked module 30 according to the second embodiment. FIG. 20B is a front sectional view showing a stacked module 130 in which eight semiconductor chips are stacked by using the stacked structure of the prior art.

The thickness of the substrates 7 and 107 is set to 0.1 mm, the thickness of the semiconductor chips 5 and 105 is set to 0.05 mm, the height from the upper surfaces of the substrates 7 and 107 to the semiconductor chips 5 and 105 mounted on the substrates 7 and 107 is set to 0.04 mm, the height from the upper surfaces of the semiconductor chips 5 and 105 to the lower surfaces of the substrates 7 and 107 arranged on the upper side of the semiconductor chips 5 and 105 is set to 0.01 mm, the height of the lands for ball 11 and 111 is set to 0.01 mm, the thickness of the insulating sheets 25 is set to 0.01 mm, and the height of the solder balls 8 and 108 is set to 0.08 mm. Under these conditions, the height of the stacked structure of the prior art and the height of the stacked structure according to the second embodiment are compared.

The height of the stacked module employing the stacked structure of the prior art is about 1.15 mm. On the other hand, the height of the stacked module 30 according to the second embodiment is about 0.72 mm. Distances among the respective members are shown in the figure.

In this way, in the stacked structure of semiconductor chips according to this embodiment, when the semiconductor chips in the same number as that of the prior art are stacked, it is possible to reduce the height compared with the structure of the prior art. Therefore, the number of semiconductor chips 5 which can be stacked increases and it is possible to realize an increase in a capacity of the SD memory card 1.

Third Embodiment

A stacked structure of semiconductor chips according to a third embodiment of the present invention is explained below. The stacked structure of semiconductor chips according to the third embodiment is the same as the stacked structure according to the second embodiment in that the structure of one module includes one substrate 7 and the semiconductor chips 5 mounted on the upper and lower surfaces of the substrate 7. However, the stacked structure of semiconductor chips according to the third embodiment is different from the stacked structure according to the second embodiment in the arrangement of modules. In the third embodiment, two stacked modules are arranged as in the second embodiment. Since the stacked modules are arranged symmetrically to each other as in the second embodiment, the structure of one stacked module is explained.

Figure 21:
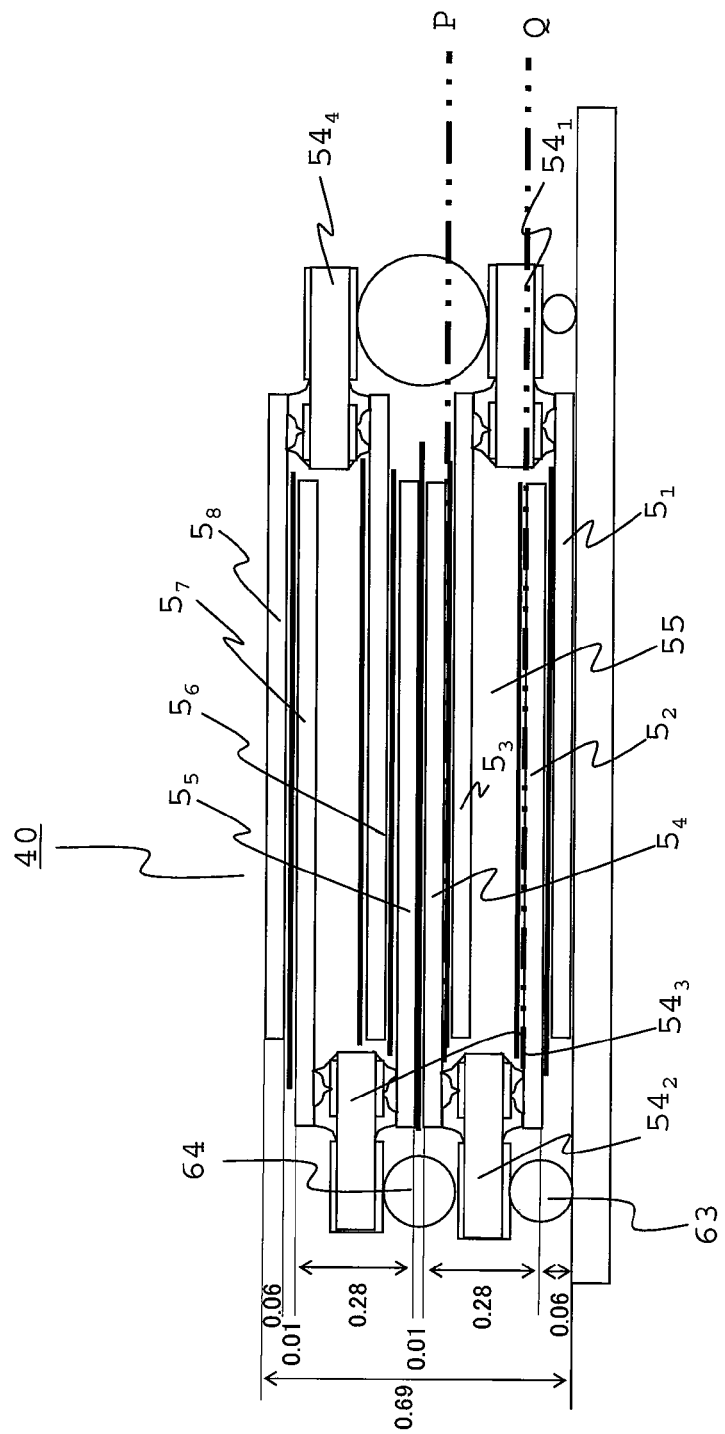
FIG. 21 is a front sectional view of a stacked module 40 according to a third embodiment of the present invention.

FIG. 21 is a front sectional view of a stacked module 40 according to the third embodiment. As shown in FIG. 21, in the stacked module 40 according to the third embodiment, one semiconductor chip 5 is arranged between the semiconductor chips 5 mounted on both the surfaces of the substrate 7.

In the stacked module 40, the semiconductor chip $5_1$ arranged at the bottom is mounted on the lower surface 16 of the substrate $7b_1$ on the right side. The semiconductor chip $5_2$ second from the bottom is mounted on the lower surface 16 of the substrate $7a_1$ on the left side. The semiconductor chip $5_3$ third from the bottom is mounted on the upper surface 15 of the substrate $7b_1$ on the right side. The semiconductor chip $5_4$ fourth from the bottom is mounted on the upper surface 15 of the substrate $7a_1$ on the left side. The semiconductor chip $5_5$ fifth from the bottom is mounted on the lower surface 16 of the substrate $7a_2$ on the left side. The semiconductor chip $5_6$ sixth from the bottom is mounted on the lower surface 16 of the substrate $7b_2$ on the right side. The semiconductor chip $5_7$ seventh from the bottom is mounted on the upper surface 15 of the substrate $7a_2$ on the left side. The semiconductor chip $5_8$ eighth from the bottom is mounted on the upper surface 15 of the substrate $7b_2$ on the right side. The solder ball 8 for electrically connecting the substrate $7b_1$ and the mother board 4 and a solder ball 62 for electrically connecting the substrate $7b_1$ and the substrate $7b_2$ are provided. A solder ball 63 for electrically connecting the substrate $7a_1$ and the mother board 4 and a solder ball 64 for electrically connecting the substrate $7a_1$ and the substrate $7a_2$ are provided.

In this way, in the stacked module 40 according to the third embodiment, in the space 55 formed by the one module 54, the other module 54 mounted on the upper side of the one module 54, is arranged to partially overlap the space 55.

"A surface including a surface on the holding member side of a semiconductor chip held on one surface of the other holding member" according to the present invention is equivalent to, for example, the surface P including the lower surface 5b of the semiconductor chip $5_4$ according to this embodiment shown in FIG. 21. "A surface including a surface on the holding member side of a semiconductor chip held on the other surface of the other holding member" according to the present invention is equivalent to, for example, the surface Q including the upper surface 5c of the semiconductor chip $5_2$ according to this embodiment shown in FIG. 21. "One semiconductor chip of semiconductor chips held on both the surfaces of the one holding member" is equivalent to, for example, the semiconductor chip $5_3$ according to this embodiment shown in FIG. 21.

When numerical values of the respective members are set in the same way as in the second embodiment, the height of the stacked module 40 is calculated as 0.69 mm. In this way, in the stacked structure of semiconductor chips according to this embodiment, when an identical number of semiconductor chips are stacked, it is possible to set the height low compared with the structure of the prior art.

In the third embodiment, the semiconductor chips 5 are arranged on both sides of the substrate $7b_1$. However, the semiconductor chip 5 does not have to be provided on the lower surface of the substrate $7b_1$. In other words, the module 54 according to the second and third embodiments and the module 10 according to the first embodiment may be combined.

Fourth Embodiment

A stacked structure of semiconductor chips according to a fourth embodiment of the present invention is explained below. The stacked structure of semiconductor chips according to the fourth embodiment is the same as the stacked structure according to the first embodiment in the basic structure but is different from the stacked structure according to the first embodiment in the arrangement of the substrates 7 adjacent to each other. Therefore, the difference is mainly explained and explanation of the respective members is omitted.

Figure 22:
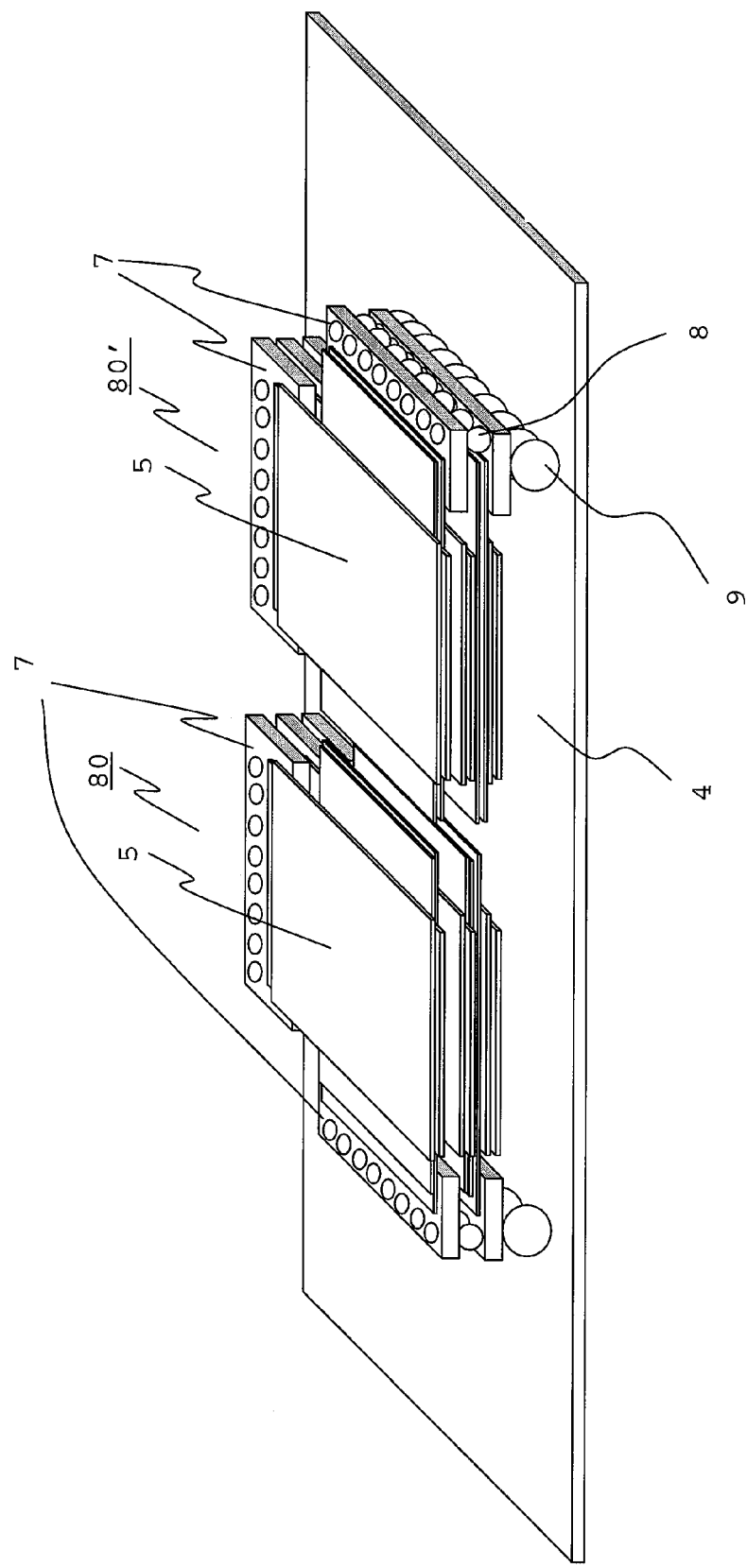
FIG. 22 is a front perspective view of stacked modules 80 and 80' according to a fourth embodiment of the present invention.

FIG. 22 is a front perspective view of stacked modules 80 and 80' according to the fourth embodiment. FIG. 23 is a rear perspective view of the same.

Since the stacked module 80' is symmetrical to the stacked module 80, only the structure of the stacked module 80 is explained below.

As shown in FIGS. 22 and 23, the stacked module 80 according to the fourth embodiment is characterized in that, unlike the stacked module 6 according to the first embodiment, the adjacent substrates 7 are arranged in directions orthogonal to each other. Therefore, respective modules to be stacked are also orthogonal to one another and the respective semiconductor chips 5 are superimposed and arranged to be orthogonal to one another viewed from a stacking direction of the stacked module 80.

Even with the structure described above, as in the structure shown in FIGS. 7A and 7B, since each of the stacked modules is at least partially arranged, on a side thereof, in a space formed by a module above the module, it is possible to obtain the effect of an increase in a capacity of the SD memory card as in the first embodiment.

In the above description, the adjacent substrates 7 orthogonal to each other are alternately arranged in different directions, whereby the modules are arranged in directions orthogonal to each other. However, the arrangement of substrates is not limited to this way. In the structure shown in FIG. 24, the adjacent substrates 7 are arranged to draw a spiral while angles thereof are shifted by 90° in a fixed direction, whereby the respective semiconductor chips 5 are superimposed and arranged to be orthogonal to one another viewed from a stacking direction of the stacked module 90. With this structure, it is possible to obtain the effect of an increase in a capacity of the SD memory card as in the first embodiment. Concerning the modules of lowest three stages, sizes of solder balls gradually increase in order of an array of the substrates 7 from the bottom module to the third module in FIG. 24.

Figure 24:
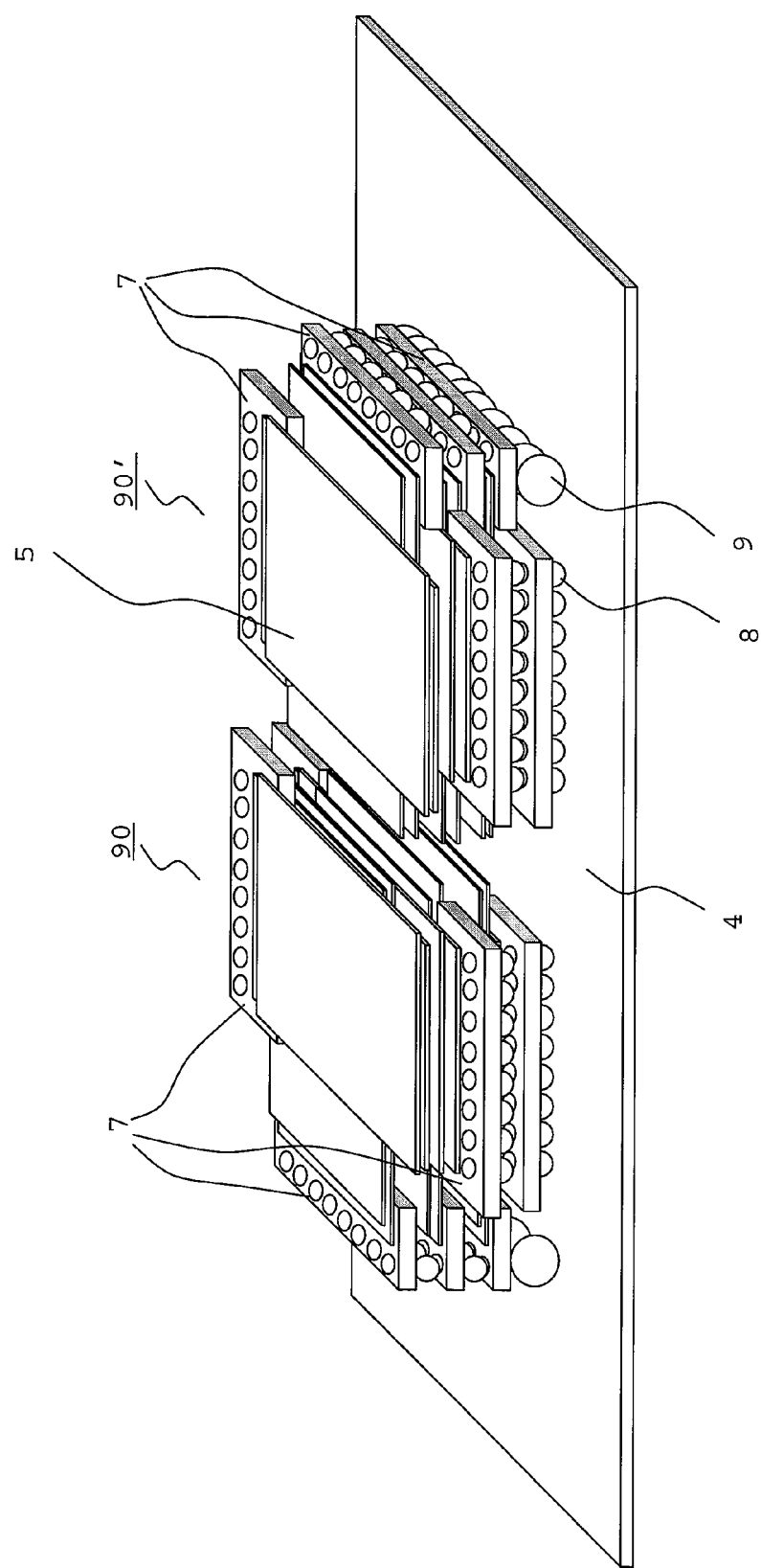
FIG. 24 is a front perspective view of stacked modules 90 and 90' as another example of the structure according to the fourth embodiment.

In the structure shown in FIG. 24, the substrates 7 are arranged in three directions orthogonal to one another. However, it is also possible that the substrate 7 orthogonal at 90° to the adjacent substrate 7 is added and the substrates are arranged in four directions orthogonal to one another. In this case, as in the case described above, order of the arrangement of the substrates 7 is set to draw a spiral.

In the above explanation, all the substrates 7 adjacent to each other are orthogonal to each other. However, a crossing angle is not limited to a right angle and may be an arbitrary angle. When the crossing angle is 180°, the structure is the same as the structures according to the first to third embodiments.

In short, in the present invention, concerning the respective stacked modules, if at least a part of a module in a lower side is arranged in a space formed by a module on an upper side viewed from a direction orthogonal to a stacking direction, it is possible to obtain an effect of an increase in a capacity. The arrangement of the modules is not limited by a form of the plane arrangement of the substrates 7 of the respective modules on the mother board 4.

Figure 25:
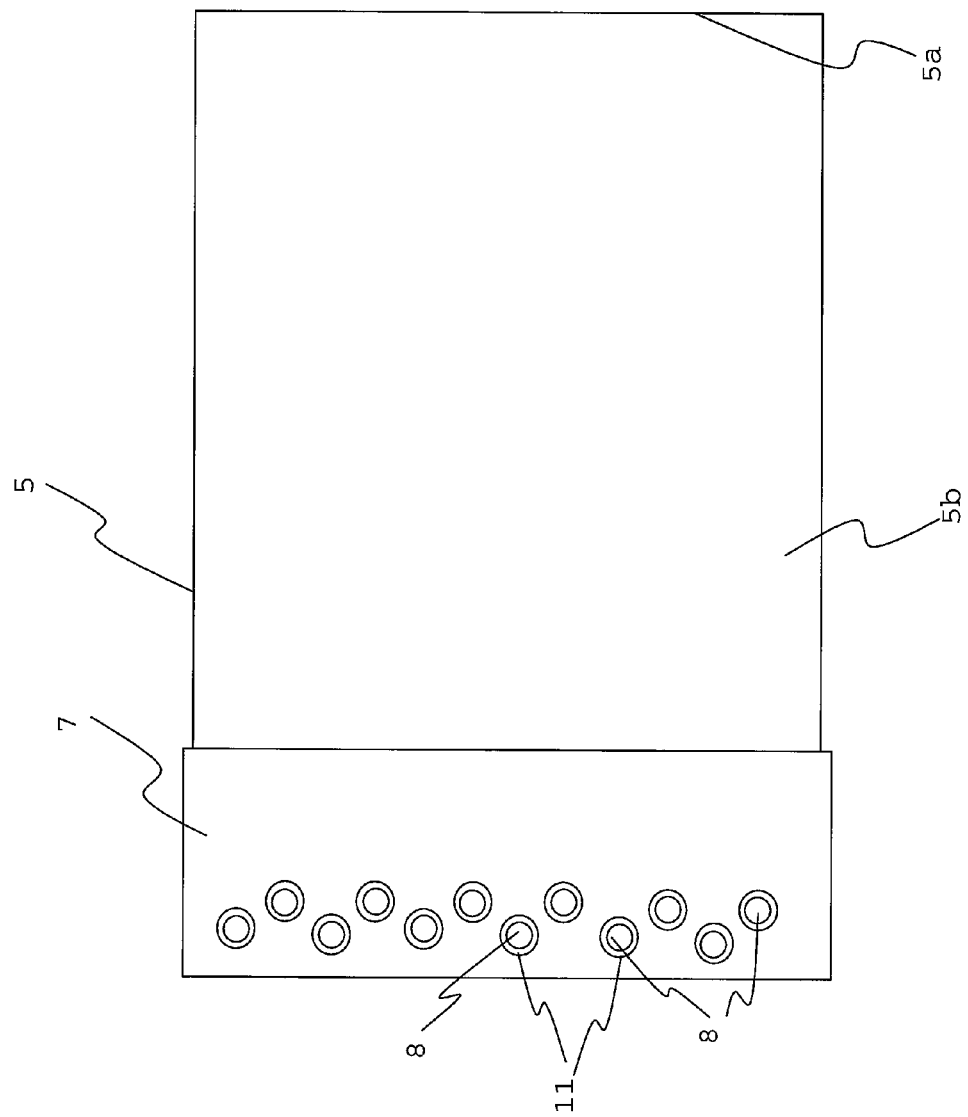
FIG. 25 is a diagram for explaining a modification of an array of solder balls and lands according to the first to third embodiments.
Figure 26:
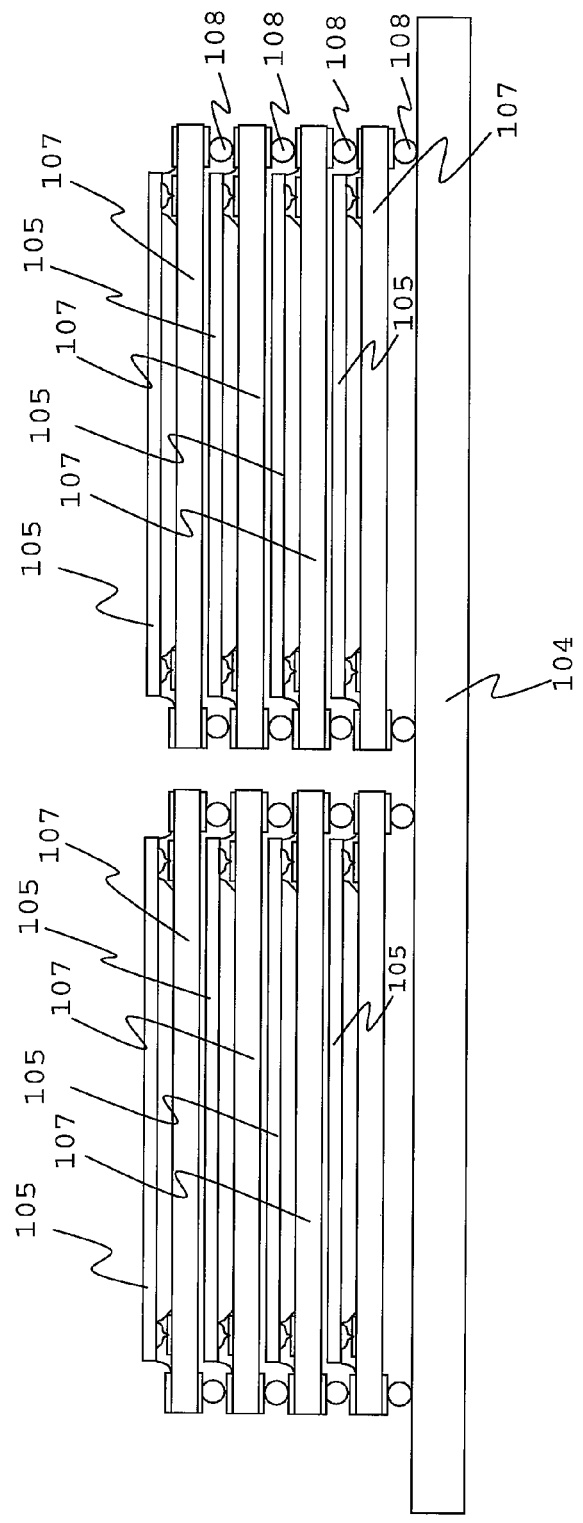
FIG. 26 is a front sectional view for explaining the stacked structure of semiconductor chips of the prior art.
Figure 27:
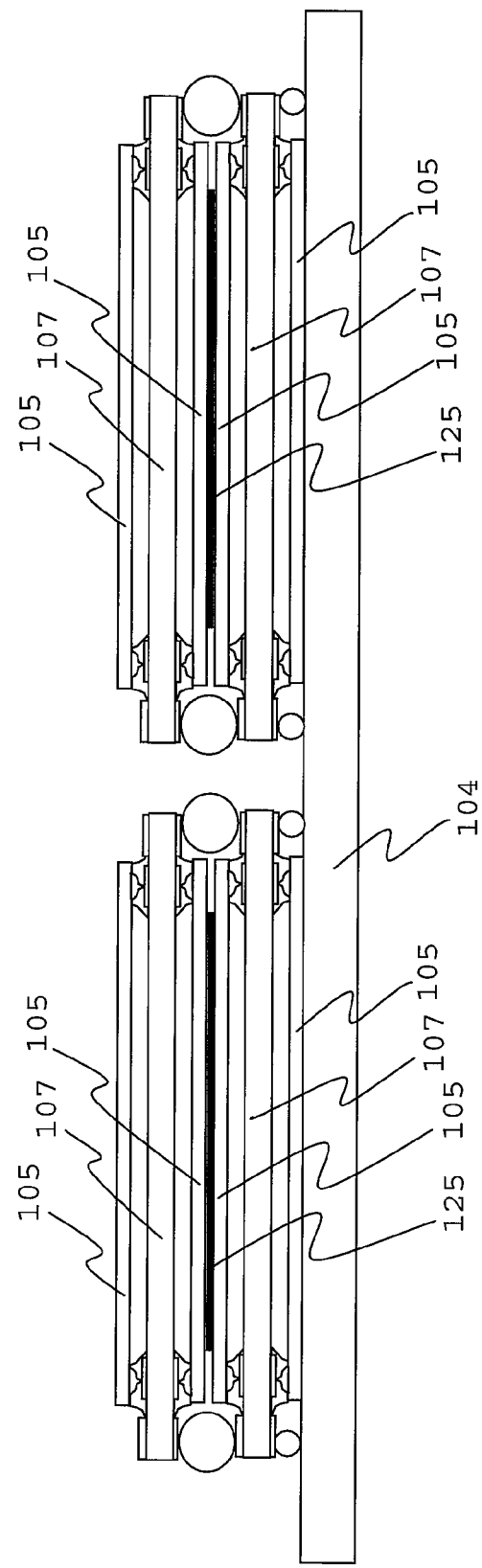
FIG. 27 is a front sectional view for explaining the stacked structure of semiconductor chips of the prior art different from that shown in FIG. 26.

In the first to fourth embodiments, the lands for ball 11 and the solder balls arranged above and below the substrates 7 are arranged in single tier in a depth direction, respectively, as shown in FIG. 2. However, the lands for ball 11 and the solder balls may be arranged in zigzag (in two rows) as shown in a rear view of the substrate 7 in FIG. 25. By arranging the lands for ball 11 and the solder balls in zigzag in this way, it is possible to more stably mount the substrates 7 and the semiconductor chips 5.

In the embodiments described above, the SD memory card is explained as an example of the memory card according to the present invention. However, the present invention is not limited to this and can also be applied to, for example, a mini SD memory card. The present invention is not limited to a memory and can be applied to the structure in which plural semiconductor chips are stacked.

The stacked structure of semiconductor chips and the method of manufacturing the stacked structure of semiconductor chips have an effect that semiconductor chips larger in number than in the prior art can be stacked and are useful for a memory card and the like.

What is claimed is:

1. A stacked structure of semiconductor chips comprising:
plural stacked semiconductor chips; and
plural tabular holding members which hold the respective semiconductor chips, wherein
at least two holding members among the holding members are arranged in places at ends of the semiconductor chips where inner side facets of the holding members are opposed to each other,
at least one semiconductor chip of the two semiconductor chips held by the two holding members, respectively, is held by only one holding member of the holding members at one end of the semiconductor chip, and
all or a part of the one semiconductor chip is arranged in the largest space positioned in an inner side of the inner side facet of the other holding member of the holding members, the largest space being formed by a surface including the one surface of the other holding member, a surface including the other surface of the other holding member, and a surface including a surface of the other semiconductor chip held by the other holding member, the other semiconductor chip being closer to the other holding member.

2. The stacked structure of semiconductor chips according to claim 1, wherein the semiconductor chip is held on at least one surface of the one holding member.

3. The stacked structure of semiconductor chips according to claim 2, wherein
the other semiconductor chip is adjacent to the one semiconductor chip and held by only the other holding member at the other end opposed to the one end, and
the largest space is a space positioned in an inner side of the inner side facet of the other holding member and is formed by a surface including a surface on an opposite side of the other semiconductor chip side of the other holding member and a surface including a surface on the holding member side of the other semiconductor chip.

4. The stacked structure of semiconductor chips according to claim 3, wherein
the plural stacked semiconductor chips have a plurality of the one semiconductor chips and a plurality of the other semiconductor chips both of which are alternately stacked, and
all or a part of the other semiconductor chip is arranged in a space positioned in an inner side of the inner side facet of the one holding member, the space being formed by a surface including a surface on an opposite side of the one semiconductor chip side of the one holding member and a surface including a surface on the one holding member side of the one semiconductor chip.

5. The stacked structure of semiconductor chips according to claim 1, wherein
the semiconductor chips are held on both surfaces of the other holding member,
the largest space is a space positioned in an inner side of the inner side facet of the other holding member and is formed by a surface including a surface on the holding member side of the semiconductor chip held on one surface of the other holding member and a surface including a surface on the holding member side of the semiconductor chip held on the other surface of the other holding member, and
arrangement of the entire one semiconductor ship or a part of the one semiconductor chip in the space means that the semiconductor chip held by the one holding member is arranged between the semiconductor chips arranged on both the surfaces of the other holding member.

6. The stacked structure of semiconductor chips according to claim 5, wherein
the semiconductor chips are held on both surfaces of the one holding member, and
one semiconductor chip of the semiconductor chips held on both the surfaces of the one holding member is arranged between the semiconductor chips arranged on both the surfaces of the other holding member.

7. The stacked structure of semiconductor chips according to claim 6, wherein one semiconductor chip of the semiconductor chips held on both surfaces of the one holding member by one holding member adjacent to the one holding member is further arranged between the semiconductor chips arranged on both the sides of the other holding member.

8. The stacked structure of semiconductor chips according to claim 1, wherein
the holding members are substrates, and
the semiconductor chips are mounted on the substrates by flip chip or wire bonding.

9. The stacked structure of semiconductor chips according to claim 8, wherein
adjacent substrates of the substrates are electrically connected by a conductive member, and
a space between the adjacent substrates is adjusted by the conductive member.

10. A memory card comprising:
a mother board on which one or plural stacked modules having the stacked structure of semiconductor chips according to claim 1 are arranged; and
an IC chip for controlling the semiconductor chips.

11. A stacked structure of semiconductor chips comprising:
plural stacked semiconductor chips; and
plural tabular holding members which hold the respective semiconductor chips, wherein
at least two holding members among the holding members are arranged in places at ends of the semiconductor chips,
at least one semiconductor chip of the two semiconductor chips held by the two holding members, respectively, is held by only one holding member of the holding members at one end of the semiconductor chip, and
all or a part of the one semiconductor chip is arranged so as to be intersected the other semiconductor chip in the view of the direction of stacking, and arranged in the largest space positioned in an inner side of the inner side facet of the other holding member of the holding members, the largest space being formed by a surface including the one surface of the other holding member, a surface including the other surface of the other holding member, and a surface including a surface of the other semiconductor chip held by the other holding member, the other semiconductor chip being closer to the other holding member.

* * * * *